(12) United States Patent
Tois et al.

(10) Patent No.: US 11,728,175 B2
(45) Date of Patent: Aug. 15, 2023

(54) DEPOSITION OF ORGANIC FILMS

(71) Applicant: ASM IP Holding B.V., Almere (NL)

(72) Inventors: Eva E. Tois, Espoo (FI); Hidemi Suemori, Helsinki (FI); Viljami J. Pore, Helsinki (FI); Suvi P. Haukka, Helsinki (FI); Varun Sharma, Helsinki (FI); Jan Willem Maes, Wilrijk (BE); Delphine Longrie, Ghent (BE); Krzysztof Kachel, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 37 days.

(21) Appl. No.: 17/130,902

(22) Filed: Dec. 22, 2020

(65) Prior Publication Data

US 2021/0175092 A1     Jun. 10, 2021

Related U.S. Application Data

(63) Continuation of application No. 16/659,012, filed on Oct. 21, 2019, now Pat. No. 10,923,361, which is a
(Continued)

(51) Int. Cl.
*H01L 21/311* (2006.01)
*H01L 21/02* (2006.01)
(Continued)

(52) U.S. Cl.
CPC ........ *H01L 21/31144* (2013.01); *C23C 16/04* (2013.01); *C23C 16/45553* (2013.01);
(Continued)

(58) Field of Classification Search
None
See application file for complete search history.

(56) References Cited

U.S. PATENT DOCUMENTS

| 4,613,398 A | 9/1986 | Chiong et al. |
| 4,804,640 A | 2/1989 | Kaganowicz |

(Continued)

FOREIGN PATENT DOCUMENTS

| EP | 0469456 A1 | 2/1992 |
| EP | 0880168 A2 | 11/1998 |

(Continued)

OTHER PUBLICATIONS

J.W. Elam et al., "New Insights into Sequential Infiltration Synthesis", ECS Transactions vol. 69, pp. 147-157. (Year: 2015).*

(Continued)

*Primary Examiner* — Jiong-Ping Lu
(74) *Attorney, Agent, or Firm* — Knobbe, Martens, Olson & Bear, LLP

(57) ABSTRACT

Processes are provided herein for deposition of organic films. Organic films can be deposited, including selective deposition on one surface of a substrate relative to a second surface of the substrate. For example, polymer films may be selectively deposited on a first metallic surface relative to a second dielectric surface. Selectivity, as measured by relative thicknesses on the different layers, of above about 50% or even about 90% is achieved. The selectively deposited organic film may be subjected to an etch process to render the process completely selective. Processes are also provided for particular organic film materials, independent of selectivity. Masking applications employing selective organic films are provided. Post-deposition modification of the organic films, such as metallic infiltration and/or carbon removal, is also disclosed.

19 Claims, 18 Drawing Sheets

Related U.S. Application Data continuation of application No. 15/486,124, filed on Apr. 12, 2017, now Pat. No. 10,453,701, which is a continuation-in-part of application No. 15/170,769, filed on Jun. 1, 2016, now Pat. No. 10,373,820.

(51) Int. Cl.

| | | |
|---|---|---|
| *H01L 21/033* | (2006.01) | |
| *H01L 21/3213* | (2006.01) | |
| *H01L 21/32* | (2006.01) | |
| *C23C 16/04* | (2006.01) | |
| *C23C 16/455* | (2006.01) | |
| *C23C 16/56* | (2006.01) | |
| *H01L 21/768* | (2006.01) | |

(52) U.S. Cl.
CPC .......... *C23C 16/56* (2013.01); *H01L 21/0228* (2013.01); *H01L 21/02118* (2013.01); *H01L 21/02178* (2013.01); *H01L 21/02186* (2013.01); *H01L 21/0337* (2013.01); *H01L 21/31138* (2013.01); *H01L 21/32* (2013.01); *H01L 21/32139* (2013.01); *H01L 21/76834* (2013.01)

(56) References Cited

U.S. PATENT DOCUMENTS

| | | | |
|---|---|---|---|
| 4,863,879 A | 9/1989 | Kwok | |
| 4,948,755 A | 8/1990 | Mo | |
| 5,288,697 A | 2/1994 | Schrepp et al. | |
| 5,366,766 A | 11/1994 | Sekiguchi et al. | |
| 5,447,887 A | 9/1995 | Filipiak et al. | |
| 5,604,153 A | 2/1997 | Tsubouchi et al. | |
| 5,633,036 A | 5/1997 | Seebauer et al. | |
| 5,869,135 A | 2/1999 | Vaeth et al. | |
| 5,925,494 A | 7/1999 | Horn | |
| 6,046,108 A | 4/2000 | Liu et al. | |
| 6,416,577 B1 | 7/2002 | Suntola et al. | |
| 6,426,015 B1 | 7/2002 | Xia et al. | |
| 6,455,414 B1 | 9/2002 | Hillman et al. | |
| 6,482,740 B2 | 11/2002 | Soininen et al. | |
| 6,586,330 B1 | 7/2003 | Ludviksson et al. | |
| 6,652,709 B1 | 11/2003 | Suzuki et al. | |
| 6,679,951 B2 | 1/2004 | Soininen et al. | |
| 6,727,169 B1 | 4/2004 | Raaijmakers et al. | |
| 6,759,325 B2 | 7/2004 | Raaijmakers et al. | |
| 6,811,448 B1 | 11/2004 | Paton et al. | |
| 6,844,258 B1 | 1/2005 | Fair et al. | |
| 6,852,635 B2 | 2/2005 | Satta et al. | |
| 6,858,533 B2 | 2/2005 | Chu et al. | |
| 6,878,628 B2 | 4/2005 | Sophie et al. | |
| 6,887,795 B2 | 5/2005 | Soininen et al. | |
| 6,902,763 B1 | 6/2005 | Elers et al. | |
| 6,921,712 B2 | 7/2005 | Soininen et al. | |
| 6,958,174 B1 | 10/2005 | Klaus et al. | |
| 7,041,609 B2 | 5/2006 | Vaartstra | |
| 7,067,407 B2 | 6/2006 | Kostamo et al. | |
| 7,084,060 B1 | 8/2006 | Furukawa et al. | |
| 7,118,779 B2 | 10/2006 | Verghese et al. | |
| 7,220,669 B2 | 5/2007 | Hujanen et al. | |
| 7,241,677 B2 | 7/2007 | Soininen et al. | |
| 7,323,411 B1 | 1/2008 | Blosse | |
| 7,405,143 B2 | 7/2008 | Leinikka et al. | |
| 7,425,350 B2 | 9/2008 | Todd | |
| 7,476,618 B2 | 1/2009 | Kilpela et al. | |
| 7,494,927 B2 | 2/2009 | Kostamo et al. | |
| 7,595,271 B2 | 9/2009 | White | |
| 7,611,751 B2 | 11/2009 | Elers | |
| 7,695,567 B2 | 4/2010 | Fu | |
| 7,754,621 B2 | 7/2010 | Putkonen | |
| 7,790,631 B2 | 9/2010 | Sharma et al. | |
| 7,799,135 B2 | 9/2010 | Verghese et al. | |
| 7,910,177 B2 | 3/2011 | Li | |
| 7,914,847 B2 | 3/2011 | Verghese et al. | |
| 7,927,942 B2 | 4/2011 | Raaijmakers | |
| 7,951,637 B2 | 5/2011 | Weidman et al. | |
| 7,955,979 B2 | 6/2011 | Kostamo et al. | |
| 7,964,505 B2 | 6/2011 | Khandelwal et al. | |
| 8,030,212 B2 | 10/2011 | Yang et al. | |
| 8,084,087 B2 | 12/2011 | Bent et al. | |
| 8,138,097 B1* | 3/2012 | Isobayashi | H01L 21/0337 438/689 |
| 8,173,554 B2 | 5/2012 | Lee et al. | |
| 8,263,488 B2 | 9/2012 | Viel et al. | |
| 8,293,597 B2 | 10/2012 | Raaijmakers | |
| 8,293,658 B2 | 10/2012 | Shero et al. | |
| 8,425,739 B1 | 4/2013 | Wieting | |
| 8,466,052 B2 | 6/2013 | Baek et al. | |
| 8,536,058 B2 | 9/2013 | Kostamo et al. | |
| 8,586,478 B2 | 11/2013 | Soda et al. | |
| 8,623,468 B2 | 1/2014 | Lin et al. | |
| 8,778,815 B2 | 7/2014 | Yamaguchi et al. | |
| 8,883,637 B2 | 11/2014 | Jeng et al. | |
| 8,890,264 B2 | 11/2014 | Dewey et al. | |
| 8,956,971 B2 | 2/2015 | Haukka et al. | |
| 8,962,482 B2 | 2/2015 | Albertson et al. | |
| 8,980,418 B2 | 3/2015 | Darling et al. | |
| 8,993,404 B2 | 3/2015 | Korbrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,136,110 B2 | 9/2015 | Rathsack | |
| 9,159,558 B2 | 10/2015 | Cheng et al. | |
| 9,236,292 B2 | 1/2016 | Romero et al. | |
| 9,257,303 B2 | 2/2016 | Haukka et al. | |
| 9,312,131 B2 | 4/2016 | Bauer et al. | |
| 9,329,483 B2 | 5/2016 | Iwao et al. | |
| 9,349,687 B1 | 5/2016 | Gates et al. | |
| 9,353,139 B2 | 5/2016 | Sundermeyer et al. | |
| 9,455,138 B1 | 9/2016 | Fukazawa et al. | |
| 9,490,145 B2 | 11/2016 | Niskanen et al. | |
| 9,502,289 B2 | 11/2016 | Haukka et al. | |
| 9,552,979 B2 | 1/2017 | Knaepen et al. | |
| 9,660,205 B2 | 5/2017 | George et al. | |
| 9,679,808 B2 | 6/2017 | Haukka et al. | |
| 9,754,779 B1 | 9/2017 | Ishikawa et al. | |
| 9,786,491 B2 | 10/2017 | Suzuki et al. | |
| 9,786,492 B2 | 10/2017 | Suzuki et al. | |
| 9,803,277 B1 | 10/2017 | Longrie et al. | |
| 9,805,974 B1 | 10/2017 | Chen et al. | |
| 9,816,180 B2 | 11/2017 | Haukka et al. | |
| 9,895,715 B2 | 2/2018 | Haukka et al. | |
| 9,911,595 B1 | 3/2018 | Smith et al. | |
| 10,014,212 B2 | 7/2018 | Chen et al. | |
| 10,041,166 B2 | 8/2018 | Longrie et al. | |
| 10,047,435 B2 | 8/2018 | Haukka et al. | |
| 10,049,924 B2 | 8/2018 | Haukka et al. | |
| 10,115,603 B2 | 10/2018 | Niskanen et al. | |
| 10,121,699 B2 | 11/2018 | Wang et al. | |
| 10,157,786 B2 | 12/2018 | Haukka et al. | |
| 10,186,420 B2 | 1/2019 | Fukazawa | |
| 10,204,782 B2 | 2/2019 | Maes et al. | |
| 10,316,406 B2 | 6/2019 | Lecordier | |
| 10,343,186 B2 | 7/2019 | Pore et al. | |
| 10,373,820 B2 | 8/2019 | Tois et al. | |
| 10,378,810 B2 | 8/2019 | Yu et al. | |
| 10,428,421 B2 | 10/2019 | Haukka et al. | |
| 10,443,123 B2 | 10/2019 | Haukka et al. | |
| 10,453,701 B2 | 10/2019 | Tois et al. | |
| 10,480,064 B2 | 11/2019 | Longrie et al. | |
| 10,508,337 B2 | 12/2019 | Iwaji | |
| 10,546,741 B2 | 1/2020 | Murakami et al. | |
| 10,553,482 B2 | 2/2020 | Wang et al. | |
| 10,566,185 B2 | 2/2020 | Wang et al. | |
| 10,695,794 B2 | 6/2020 | Pore et al. | |
| 10,741,411 B2 | 8/2020 | Niskanen et al. | |
| 10,793,946 B1 | 10/2020 | Longrie et al. | |
| 10,814,349 B2 | 10/2020 | Pore et al. | |
| 10,847,361 B2 | 11/2020 | Wang et al. | |
| 10,847,363 B2 | 11/2020 | Tapily | |
| 10,854,460 B2 | 12/2020 | Tois et al. | |
| 10,872,765 B2 | 12/2020 | Tois et al. | |
| 10,900,120 B2 | 1/2021 | Sharma et al. | |

(56) References Cited

U.S. PATENT DOCUMENTS

| | | | |
|---|---|---|---|
| 10,903,113 B2 | 1/2021 | Wang et al. |
| 10,923,361 B2 | 2/2021 | Tois et al. |
| 11,094,535 B2 | 8/2021 | Tois et al. |
| 11,387,107 B2 | 7/2022 | Tois et al. |
| 11,389,824 B2 | 7/2022 | Pore et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2001/0054599 A1* | 12/2001 | Engelhardt ....... H01L 21/32139 216/75 |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0046422 A1* | 3/2006 | Tran ................... H01L 21/0337 257/E21.68 |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0081827 A1 | 3/2009 | Yang et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0266785 A1 | 10/2010 | Kurachi et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao et al. |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0164829 A1 | 6/2012 | Rajagopalan et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0170853 A1 | 6/2014 | Shamma et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273492 A1 | 9/2014 | Anthis |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2014/0349107 A1 | 11/2014 | Thoumazet et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagai et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0140694 A1 | 5/2015 | Inoue et al. |
| 2015/0162214 A1 | 6/2015 | Thompson et al. |

(56) References Cited

U.S. PATENT DOCUMENTS

| | | |
|---|---|---|
| 2015/0170961 A1 | 6/2015 | Romero et al. |
| 2015/0179798 A1 | 6/2015 | Clendenning et al. |
| 2015/0184296 A1 | 7/2015 | Xu et al. |
| 2015/0200132 A1 | 7/2015 | Chi et al. |
| 2015/0217330 A1 | 8/2015 | Haukka et al. |
| 2015/0240121 A1 | 8/2015 | Sugita et al. |
| 2015/0247238 A1 | 9/2015 | Pasquale et al. |
| 2015/0270140 A1 | 9/2015 | Gupta et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0024659 A1 | 1/2016 | Shimamoto et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0104628 A1 | 4/2016 | Metz et al. |
| 2016/0126097 A1 | 5/2016 | Glodde et al. |
| 2016/0126305 A1 | 5/2016 | Cheng et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0322213 A1 | 11/2016 | Thompson et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0062210 A1 | 3/2017 | Visser et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0190489 A1 | 7/2018 | Li et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0010953 A1 | 1/2020 | Haukka et al. |
| 2020/0051829 A1 | 2/2020 | Tois et al. |
| 2020/0066512 A1 | 2/2020 | Tois et al. |
| 2020/0105515 A1 | 4/2020 | Maes et al. |
| 2020/0181766 A1 | 6/2020 | Haukka et al. |
| 2020/0324316 A1 | 10/2020 | Pore et al. |
| 2020/0365416 A1 | 11/2020 | Niskanen et al. |
| 2021/0001373 A1 | 1/2021 | Pore et al. |
| 2021/0151324 A1 | 5/2021 | Tois et al. |
| 2021/0175092 A1 | 6/2021 | Tois et al. |

FOREIGN PATENT DOCUMENTS

| | | |
|---|---|---|
| EP | 1340269 | 2/2009 |
| EP | 3026055 | 6/2016 |
| JP | S61-284924 | 12/1986 |
| JP | H02-033153 | 2/1990 |
| JP | H08/222569 | 8/1996 |
| JP | 2001-127068 | 5/2001 |
| JP | 2001-308071 | 11/2001 |
| JP | 2004-281479 | 10/2004 |
| JP | 2008-311603 | 12/2008 |
| JP | 4333900 | 9/2009 |
| JP | 2009/231783 | 10/2009 |
| JP | 2010-232316 | 10/2010 |
| JP | 2010-532917 | 10/2010 |
| JP | 2011-018742 | 1/2011 |
| JP | 2011/0187583 | 9/2011 |
| JP | 2011/222779 | 11/2011 |
| JP | 2013/229622 | 11/2013 |
| JP | 2013/247287 | 12/2013 |
| JP | 2014/093331 | 5/2014 |
| JP | 2014/150144 | 8/2014 |
| JP | 2014-523486 | 9/2014 |
| JP | 2015/099881 | 5/2015 |
| KR | 1020010010172 | 2/2001 |
| KR | 10-2002-0010821 | 2/2002 |
| KR | 20030027392 | 4/2003 |
| KR | 1020040056026 | 6/2004 |
| KR | 10-2005-0103811 | 11/2005 |
| KR | 2005-0106433 | 11/2005 |
| KR | 10-0869326 | 11/2008 |
| KR | 10-0920033 | 10/2009 |
| KR | 10-2010-0093859 | 8/2010 |
| KR | 10-2012-0120902 | 11/2012 |
| KR | 2014-0078551 | 6/2014 |
| KR | 10-2016-0061983 | 6/2016 |
| TW | 175767 | 8/2003 |
| TW | 2005/39321 A | 12/2005 |
| TW | 2010/05827 A | 2/2010 |
| TW | 2010-27766 | 7/2010 |
| TW | 2013-08422 | 2/2013 |
| TW | 2014/39365 A | 10/2014 |
| TW | 2015-46314 | 12/2015 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014/209390 | 12/2014 |
| WO | WO 2015/047345 | 4/2015 |
| WO | WO2015047345 * 4/2015 ............ H01L 21/31 |
| WO | WO 2015/094305 | 6/2015 |
| WO | WO 2015/137812 | 9/2015 |
| WO | WO 2015/147843 | 10/2015 |
| WO | WO 2015/147858 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Aaltonen et al. (2004) Atomic layer deposition of iridium thin films. Journal of the Electrochemical Society. 151(8):G489-G492.

Benzotriazole, Wikipedia via https://en.wikipedia.org/wiki/Benzotriazole; pp. 1-5, no date available.

Cameron et al., "Molecular layer deposition", ECS Transactions, 58(10):263-275, The Electrochemical Society (2013).

(56) References Cited

OTHER PUBLICATIONS

Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Formic Acid, Wikipedia via https://en.wikipedia.org/wiki/Formic_acid; pp. 1-5, no date available.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hu et al. "Coating strategies for atomic layer deposition", Nanotechnol. Rev. 2017; 6(6): pp. 527-547.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lemonds, A.M., "Atomic layer deposition of TaSix thin films on SiO2 using TaF5 and Si2H6", Thin Solid Films 488, 2005 pp. 9-14.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.
Shao et al., "Layer-by-layer polycondensation of nylon 66 by alternating vapor deposition polymerization", Polymer, vol. 38(2):459-462 (1997).
Suntola, "Handbook of Crystal Growth. vol. 3., Thin Films and Epitaxy, Part B: Growth mechanisms and Dynamics", Amsterdam: North Holland, Elsevier Science Publishers (1994), Chapter 14, pp. 601-663.
Ting, et al., "Selective Electroless Metal Deposition for Integrated Circuit Fabrication", J. Electrochem. Soc., vol. 136, No. 2, Feb. 1989, pp. 456-462.
Wang et al., "Low-temperature plasma-enhanced atomic layer deposition of tin oxide electron selective layers for highly efficient planar perovskite solar cells", Journal of Materials Chemistry A, 2016, 4, pp. 12080-12087.
Office Action dated Dec. 15, 2020 in Japanese Patent Application No. 2016-197037.
Office Action dated Jan. 6, 2021 in Taiwanese Patent Application No. 106117800.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Au et al., "Selective Chemical Vapor Deposition of Manganese Self/Aligned Capping Layer for Cu Interconnections in Microelectronics", Journal of the Electrochemical Society, vol. 157, No. 6, 2010, pp. D341/D345.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2/857/C2/864.
Burton, et al., "Atomic Layer Deposition of MgO Using Bis(ethylcyclopentadienyl)magnesium and H20". J. Phys. Chem. C, 2009, 113, 1939/1946.
Burton, et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249/8257.
Carlsson, J., "Precursor Design for Chemical Vapour Deposition", Acta Chemica Scandinavica, vol. 45, 1991, pp. 864/869.
Chang et al., "Influences of damage and contamination from reactive ion etching on selective tungsten deposition in a low/pressure chemical/vapor/deposition reactor", J. Appl. Phys., vol. 80, No. 5, Sep. 1, 1996, pp. 3056/3061.
Chen et al., Highly Stable Monolayer Resists for Atomic Layer Deposition on Germanium and Silicon, Chem. Matter, vol. 18, No. 16, pp. 3733/3741, 2006.
Coclite, et al.; 25th Anniversary Article: CVD Polymers: A New Paradigm for Surface Modification and Device Fabrication; Advanced Materials; Oct. 2013; 25; pp. 5392/5423.
Elam et al., "Kinetics of the WF6 and Si2H6 surface reactions during tungsten atomic layer deposition", Surface Science, vol. 479, 2001, pp. 121/135.
Elam et al., "Nucleation and growth during tungsten atomic layer deposition on SiO2 surfaces", Thin Solid Films, vol. 386, 2001 pp. 41/52.
Ellinger et al., "Selective Area Spatial Atomic Layer Deposition of ZnO, Al2O3, and Aluminum-Doped ZnO Using Poly(vinyl pyrrolidone)", Chem Mater. 2014, 26:1514-1522.
Fabreguette et al., Quartz crystal microbalance study of tungsten atomic layer deposition using WF6 and Si2H6, Thin Solid Films, vol. 488, 2005, pp. 103/110.
Farm et al. Selective/Area Atomic Layer Deposition Using Poly( methyl methacrylate) Films as Mask Layers, J. Phys. Chem. C, 2008, 112, pp. 15791/15795. (Year: 2008).
Farr, Isaac Vincent; Synthesis and Characterization of Novel Polyimide Gas Separation Membrane Material Systems, Chapter 2; Virginia Tech Chemistry PhD Dissertation; URN # etd/080999/123034; Jul. 26, 1999.
File History of U.S. Appl. No. 13/702,992, filed Mar. 26, 2013.
File History of U.S. Appl. No. 13/708,863, filed Dec. 7, 2012.
File History of U.S. Appl. No. 15/177,195, filed Jun. 8, 2016.
George, Steven M.; Atomic Layer Deposition: An Overview; Chem. Rev. 2010, 110, pp. 111-131; Feb. 12, 2009.
George, et al., "Surface Chemistry for Molecular Layer Deposition of Organic and Hybrid Organic-Inorganic Polymers," Accounts of Chemical Research, vol. 42, pp. 498-508, 2009.
Ghosal et al., Controlling Atomic Layer Deposition of TiO2 in Aerogels through Surface Functionalization, Chem. Matter, vol. 21, pp. 1989/1992, 2009.
Grubbs et al., "Nucleation and growth during the atomic layer deposition of W on Al2O3 and Al2O3 on W", Thin Solid Films, vol. 467, 2004, pp. 16/27.
Hymes et al., "Surface cleaning of copper by thermal and plasma treatment in reducing and inert ambients", J. Vac. Sci. Technol. B, vol. 16, No. 3, May/Jun. 1998, pp. 1107/1109.
International Search Report and Written Opinion dated Feb. 17, 2012 in Application No. PCT/US2011/039970, filed Jun. 10, 2011 in 12 pages.
International Search Report and Written Opinion dated Jun. 16, 2017 in Application No. PCT/US2017/026518, filed Apr. 7, 2017 in 13 pages.
International Search Report and Written Opinion dated Jun. 22, 2017 in Application No. PCT/US2017/026519, filed Apr. 7, 2017 in 12 pages.
International Search Report and Written Opinion dated Jun. 20, 2017 in Application No. PCT/US2017/026515, filed April 7, 2017in 11 pages.
King, Dielectric Barrier, Etch Stop, and Metal Capping Materials for State of the Art and beyond Metal Interconnects, ECS Journal of Solid State Science and Technology, vol. 4, Issue 1, pp. N3029/N3047, 2015.

(56) References Cited

OTHER PUBLICATIONS

Klaus et al., "Atomic layer deposition of tungsten using sequential surface chemistry with a sacrificial stripping reaction", Thin Solid Films, vol. 360, 2000, pp. 145/153.

Klaus et al., "Atomically controlled growth of tungsten and tungsten nitride using sequential surface reactions", Applied Surface Science 162/163, 2000, pp. 479/491.

Lee et al., Area-Selective Atomic Layor Deposition Using Self/ Assembled Monolayer and Scanning Probe Lithography, Journal of The Electrochemical Society, vol. 156, Issue 9, pp. G125/G128, 2009.

Lei et al., "Real/time observation and opitimization of tungsten atomic layer deposition process cycle", J. Vac. Sci. Technol. B, vol. 24, No. 2, Mar./Apr. 2006, pp. 780/789.

Lemonds, A.M., "Atomic Layer Deposition and Properties of Refractory Transition Metal/Based Copper/Diffusion Barriers for ULSI Interconnect", The University of Texas at Austin, 2003, Dissertation in 216 pages.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490/498.

Liang, et al., "Growth of Ge Nanofilms Using Electrochemical Atomic Layer Deposition, with a "Bait and Switch" Surface/ Limited Reaction". JACS, 2011, 133:8199-8204.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Low et al., Selective deposition of CVD iron on silicon dioxide and tungsten, Microelectronic Engineering 83, pp. 2229-2233, 2006.

Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high/purity Pt nanostructures by combining electron beam induced deposition and atomic layer deposition, J Appl Phys., vol. 107, pp. 116102/1-116102/3, 2010.

Mackus, et al., The use of atomic layer deposition in advanced nanopatterning; Nanoscale (2014) 6:10941-10960.

Maluf et al., "Selective tungsten filling of sub/0.25µm trenches for the fabrication of scaled contacts and x/ray masks", J. Vac. Sci. Technol. B, vol. 8, No. 3, May/Jun. 1990, pp. 568-569.

Norrman, et al.; 6 Studies Of Spin/Coated Polymer Films; Annu. Rep. Prog. Chem.; Sect. C; 2005; 101; pp. 174-201.

Notice of Allowance dated Apr. 5, 2017 in U.S. Appl. No. 15/177,195.

Office Action dated Aug. 29, 2014 in U.S. Appl. No. 13/702,992.

Office Action dated Nov. 7, 2014 in U.S. Appl. No. 13/708,863.

Overhage et al., Selective Atomic Layer Deposition (SALD) of Titanium Dioxide on Silicon and Copper Patterned Substrates, Journal of Undergraduate Research 4, 29, Mar. 2011 in 4 pages.

Parulekar et al., Atomic Layer Deposition of Zirconium Oxide on Copper Patterned Silicon Substrate, Journal of Undergraduate Research, vol. 7, pp. 15-17, 2014.

Parulekar et al., Selective atomic layer deposition of zirconium oxide on copper patterned silicon substrate, pp. 1-6, 2013.

Prasittichai et al., "Area Selective Molecular Layer Deposition of Polyurea Film", Applied Materials & Interfaces, 2013, 5:13391-13396.

Proslier et al., "Atomic Layer Deposition and Superconducting Properties of NbSi Films", The Journal of Physical Chemistry C, 2011, vol. 115, No. 50, pp. 1-26.

Putkonen, et al.; Atomic Layer Deposition Of Polyimide Thin Films; Journal of Materials Chemistry; 2007, 17, pp. 664-669.

Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd/051799/162256; Apr. 26, 1999 in 29 pages.

Roberts et al., "Selective Mn deposition on Cu lines", poster presentation, 12th International Conference on Atomic Layer Deposition, Jun. 19, 2012, Dresden, Germany; in 1 page.

Sapp, et al.; Thermo/Mechanical and Electrical Characterization of Through/Silicon Vias with a Vapor Deposited Polyimide Dielectric Liner; IEEE; 2012.

Schmeißer, Decomposition of formic acid, Chemnitz University of Technology, pp. 1/13, Aug. 31, 2011.

Schmeißer, Reduction of Copper Oxide by Formic Acid an ab/initio study, Chemnitz University of Technology, pp. 1/42, Sep. 2011.

Schuisky, et al., Atomic Layer Deposition of Thin Films Using O2 as Oxygen Source; Langmuir (2001) 17:5508-5512.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601/1-010601/4, Jan. 2014.

Senesky et al., "Aluminum nitride as a masking material for the plasma etching of silicon carbide structures," 2010, IEEE, pp. 352/355.

Sundberg, et al., "Organic and Inorganic-Organic Thin Film Structures By Molecular Layer Deposition: A Review," Beilstein Journal of Nanotechnology, vol. 5, pp. 1104-1136, 2014.

Suntola, "Handbook of Crystal Growth. vol. 3., Thin Films and Epitaxy, Part B: Growth mechanisms and Dynamics", Amsterdam: North Holland, Elsevier Science Publishers (1994), Chapter 14, pp. 601-662.

Toirov, et al.; Thermal Cyclodehydration of Polyamic Acid Initiated by UV/Irradiation; Iranian Polymer Journal; vol. 5, No. 1; pp. 16/22; 1996; Iran.

Vallat et al., Selective deposition of Ta2O5 by adding plasma etching super/cycles in plasma enhanced atomic layer deposition steps, Journal of Vacuum Science & Technology A, vol. 35, No. 1, pp. 01B104/1-01B104/7, Jan. 2017.

Vervuurt et al. "Area/selective atomic layer deposition of platinum using photosensitive polymide," (2016) Nanotechnology 27.40 (2016): 405302.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Zhou, et al.; Fabrication of Organic Interfacial Layers By Molecular Layer Deposition: Present Status and Future Opportunities; Journal of Vacuum Science & Technology; A 31 (4), 040801/1 to 040801/18; 2013 in 18 pages.

Office Action dated Apr. 8, 2020 in Taiwan Application No. 105132286.

\* cited by examiner

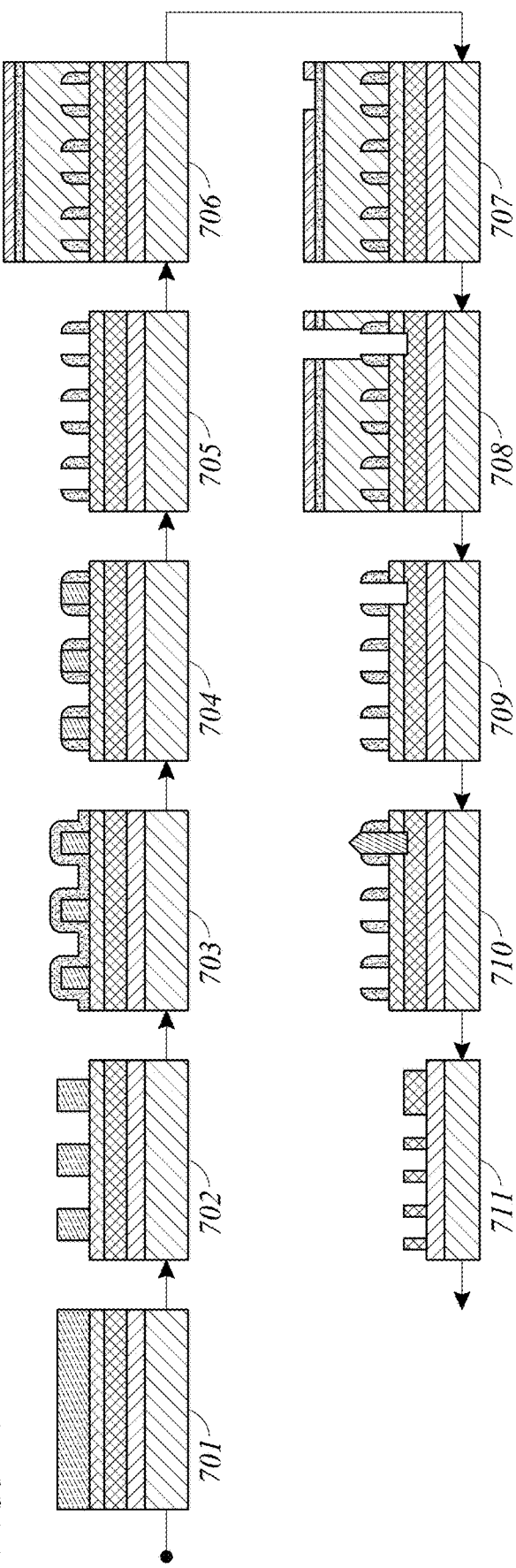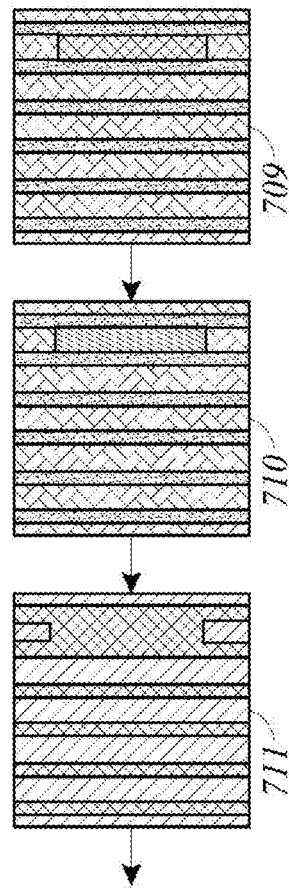
FIG. 7A
FIG. 7B

DEPOSITION OF ORGANIC FILMS

CROSS-REFERENCE TO RELATED APPLICATIONS

The present application is a continuation of U.S. application Ser. No. 16/659,012 filed Oct. 21, 2019, entitled "DEPOSITION OF ORGANIC FILMS," which is a continuation of U.S. application Ser. No. 15/486,124 filed Apr. 12, 2017, entitled "DEPOSITION OF ORGANIC FILMS," now U.S. Pat. No. 10,453,701, which is a continuation-in-part of U.S. Application No. U.S. application Ser. No. 15/170,769, filed Jun. 1, 2016, entitled "DEPOSITION OF ORGANIC FILMS," now U.S. Pat. No. 10,373,820, the disclosures of each of which are hereby incorporated herein by reference in their entireties.

This application is also related to U.S. application Ser. No. 15/070,594, filed Mar. 15, 2016, entitled "VAPOR PHASE DEPOSITION OF ORGANIC FILMS," now U.S. Pat. No. 10,343,186, and to U.S. application Ser. No. 14/879,962, filed Oct. 9, 2015, entitled "VAPOR PHASE DEPOSITION OF ORGANIC FILMS," now U.S. Pat. No. 10,695,794, the disclosures of which are hereby incorporated herein by reference in their entireties.

BACKGROUND

Field

The present disclosure relates to deposition of organic thin films, including selective deposition on a first surface of a substrate relative to a second surface. Processes are also provided for particular organic film materials, independent of selectivity.

Description of the Related Art

Organic thin films have valuable optical, thermal, electrical and mechanical properties and are widely used in the electronics, medical engineering, defense, pharmaceutical, and micro- and nanotechnology industries. Polymers in the microelectronics and photonics industries include, among other examples, photon- or electron-curable/degradable polymers for lithographic patterning; and polyimides for packaging, interlayer dielectrics and flexible circuit boards. Norrman et al., *Annu. Rep. Prog. Chem.*, Sect. C, 2005, 101, 174-201.

Polymer thin films can be used, for example, as a starting point in semiconductor applications for amorphous carbon films or layers. Polyimide films are valuable for their thermal stability and resistance to mechanical stress and chemicals. For example, polyimide films can also be used as antireflection layers to improve pattern definition and reduce misalignment in lithography steps, as layers in multiple patterning (e.g., SDDP, SDQP), as insulating materials for interlayer dielectric materials, as the gate dielectric in all-organic thin film transistors, as passivation films in packaging applications, as mask layers in etching processes, etc. Similarly, polyamide and other organic films are valuable for their electrical properties and material properties for numerous applications. Polyamide films may be used, for example, as insulating materials for interlayer dielectric materials in integrated circuit fabrication, and the photosensitivity of polyamide through ultraviolet (UV) curing allows patterning without separate photoresist.

Polymer thin films have traditionally been fabricated through spin-coating techniques. The spin-coating method forms highly functional polymer films by coating a rotating disc with a liquid material and sintering the liquid. However, tailoring of spin-applied films is limited for several reasons. For instance, formation of uniform thin films on a substrate is difficult to control, in part because of the viscosity of the starting liquid, and it can be difficult to fill the gaps of very small features (e.g., trenches or gaps between metal lines) without void generation after curing. Also, spin-coating over high topography relative to the desired thickness of the layer can result in discontinuous and non-conformal deposition. As semiconductor chip sizes continue to shrink, thinner and higher-strength films with more tunable morphology are required.

Recently, vapor phase deposition processes such as chemical vapor deposition (CVD), vapor deposition polymerization (VDP), molecular layer deposition (MLD), and sequential deposition processes such as atomic layer deposition (ALD) and cyclical CVD have been applied to the formation of polymer thin films. In CVD, a film is deposited when reactants react on a substrate surface. Gases of one or more reactants are delivered to one or more substrates in a reaction chamber. In thermal CVD, reactant gases react with one another on a hot substrate to form thin films, with the growth rate typically influenced by the temperature and the amount of reactant supplied. In plasma enhanced CVD, one or more reactants can be activated in a remote plasma generator or in situ. CVD can be performed cyclically with intervening pauses or film treatments. In ALD, deposition is also conducted by cyclical exposure of substrates to reactants, where films are built up through self-saturating reactions between the substrate surface and vapor reactants performed in cycles. The substrate or wafer is exposed to vapor phase reactants, alternatingly and repeatedly, to form a thin film of material on the substrate. In a typical process, one reactant adsorbs in a self-limiting process on the substrate. A different, subsequently pulsed reactant reacts with the adsorbed species of the first reactant to form no more than a single molecular layer of the desired material. Thicker films are produced through repeated growth cycles until the target thickness is achieved. Plasma enhanced variants of ALD, and hybrid ALD/CVD processes (e.g., with some overlap of the substrate exposure to reactant supplies) are also known.

In many applications, for example in forming etches masks, polymer films are formed and subsequently patterned over a substrate. Typically, this patterning is achieved using photolithographic techniques. However, precise placement of the lithographic pattern is required in order to correctly align the patterned polymer film with the underlying substrate features. Often such patterning results in misaligned patterned polymer films. Further, the need for precision placement of the lithographic pattern can introduce complexities into processes where such techniques are used. A need exists for more efficient and reliable techniques for depositing polymer films and for depositing polymer films aligned to features of an underlying substrate. A similar need exists for films containing metal or metallic compounds aligned to features of an underlying substrate.

SUMMARY OF THE INVENTION

In some aspect, processes for selectively depositing an organic film on a substrate comprising a first surface and a second surface are provided. In some embodiments the process may comprise one or more deposition cycles comprising contacting the substrate with a first vapor phase precursor, and contacting the substrate with a second vapor phase precursor, wherein contacting the substrate with the first and second vapor phase precursors forms the organic thin film selectively on the first surface relative to the second surface. In some embodiments processes may further comprise repeating the contacting steps until an organic thin film of a desired thickness has been formed. In some embodiments the first surface may be a metallic surface. In some embodiments the second surface may be a dielectric surface. In some embodiments the organic film may comprise a polyimide film. In some embodiments the substrate may be contacted with the second vapor phase precursor before the substrate is contacted with the first vapor phase precursor. In some embodiments the first vapor phase precursor may comprise a diamine. In some embodiments the substrate is contacted with the first vapor phase precursor comprising a diamine before it is contacted with another, different precursor.

In some embodiments the first vapor phase precursor comprises 1,6-diamnohexane (DAH). In some embodiments the second vapor phase precursor comprises a dianyhydride. In some embodiments the second vapor phase precursor comprises pyromellitic dianhydride (PMDA). In some embodiments the substrate is held at a temperature of greater than about 170° C. during the one or more deposition cycles. In some embodiments the organic film comprises a polyamide film. In some embodiments the first vapor phase precursor comprises a halogen. In some embodiments the first vapor phase precursor comprises adipoyl chloride (AC). In some embodiments the second vapor phase precursor comprises a diamine. In some embodiments the second vapor phase precursor comprises an ethylene diamine. In some embodiments the substrate is held at a temperature of greater than about 80° C. during the one or more deposition cycles. In some embodiments the organic film is deposited on the first surface relative to the second surface with a selectivity of above about 10%. In some embodiments the organic film is deposited on the first surface relative to the second surface with a selectivity of above about 50%. In some embodiments the organic film is deposited on the first surface relative to the second surface with a selectivity of above about 80%. In some embodiments the first surface comprises a metal oxide, elemental metal, or metallic surface. In some embodiments the first surface comprises tungsten. In some embodiments the second surface comprises silicon. In some embodiments the second surface comprises $SiO_2$. In some embodiments the process is an atomic layer deposition (ALD) type process.

In some embodiments the process may further comprise subjecting the substrate to an etch process, wherein the etch process removes substantially all of any deposited organic film from the second surface of the substrate and does not remove substantially all of the deposited organic film from the first surface of the substrate. In some embodiments the etch process comprises exposing the substrate to hydrogen atoms, hydrogen radicals, hydrogen plasma, or combinations thereof. In some embodiments the etch process comprises exposing the substrate to oxygen atoms, oxygen radicals, oxygen plasma, or combinations thereof. In some embodiments the etch process may comprise exposing the substrate to plasma comprising noble gas species, for example Ar or He species, with or without additional reactive species.

In some aspects processes for selectively depositing an organic film on a substrate comprising a first surface and a second surface are provided. In some embodiments the processes may comprise one or more deposition cycles comprising alternately and sequentially contacting the substrate with a first vapor phase precursor and a second vapor phase precursor, wherein the organic film is selectively formed on the first surface of the substrate relative to the second surface of the substrate. In some embodiments the first surface is a metallic surface. In some embodiments the second surface is a dielectric surface. In some embodiments the organic film is deposited on the first surface relative to the second surface with a selectivity of above about 50%.

In some aspects processes for depositing a polyamide film on a substrate are provided. In some embodiments the processes may comprise one or more deposition cycles comprising contacting the substrate with a first vapor phase precursor comprising 5 or fewer carbon atoms, contacting the substrate with a second vapor phase precursor comprising 3 or fewer carbons, and wherein contacting the substrate with the first and second vapor phase precursors forms a polyamide film of a desired thickness. In some embodiments the process is a vapor deposition process. In some embodiments the process is a molecular layer deposition (MLD) process. In some embodiments the substrate comprises a first surface and a second, different surface. In some embodiments the polyamide film is formed selectively on the first surface of the substrate relative to the second surface of the substrate. In some embodiments the first vapor phase precursor comprises chlorine or dicarboxylic acid. In some embodiments the first vapor phase precursor comprises adipoyl chloride (AC). In some embodiments the second vapor phase precursor comprises an amine. In some embodiments the second vapor phase precursor comprises ethylene diamine (EDA).

In some aspects processes are provided for selectively forming an organic thin film on a substrate comprising a first surface and a second surface. In some embodiments the processes may comprise depositing an organic thin film on the first surface of the substrate and the second surface of the substrate, and exposing the deposited organic thin film to an etchant, wherein exposing the deposited organic thin film to an etchant removes substantially all of the deposited organic thin film from the second surface of the substrate and does not remove substantially all of the deposited organic thin film from the first surface of the substrate. In some embodiments depositing an organic film on the first surface of the substrate and the second surface of the substrate comprises selectively depositing the organic thin film on the first surface of the substrate relative to the second surface of the substrate.

According to some aspects processes for forming an etch mask on a first surface of a substrate comprising the first surface and a second surface are provided. In some embodiments the process may comprise contacting the substrate with a first vapor phase precursor and contacting the substrate with a second vapor phase precursor, wherein contacting the substrate with the first and second vapor phase precursors forms an organic film selectively on the first surface relative to the second surface. The etch mask comprises the organic film formed on the first surface of the substrate.

In some embodiments the contacting steps may comprise a deposition cycle and the process may comprise one or more deposition cycles. In some embodiment the process may further comprise repeating the contacting steps until an etch mask of a desired thickness has been formed. In some embodiments the first surface is a metallic surface. In some embodiments the second surface is a dielectric surface. In some embodiments the organic film comprises a polyimide film. In some embodiments the first vapor phase precursor comprises a diamine. In some embodiments the first vapor phases precursor comprises 1,6-diamnohexane (DAH). In some embodiments the second vapor phase precursor comprises a dianyhydride. In some embodiments the second vapor phase precursor comprises pyromellitic dianhydride (PMDA). In some embodiments the process may further comprise subjecting the substrate to an etch process, wherein the etch process removes substantially all of any formed organic film from the second surface of the substrate and does not remove substantially all of the formed organic film from the first surface of the substrate. In some embodiments the etch mask is used in a tone reversal process. In some embodiments the etch mask comprises a block mask for use in a block mask process.

According to some aspects processes for forming an infiltrated film on a first surface of a substrate comprising the first surface and a second surface are provided. In some embodiments a process comprises performing a selective deposition process comprising contacting the substrate with a first vapor phase precursor and contacting the substrate with a second vapor phase precursor, wherein contacting the substrate with the first and second vapor phase precursors forms an organic thin film selectively on the first surface relative to the second surface. The selectively formed organic film is subjected to an infiltration process to incorporate a metal into the selectively formed organic film and thereby form the infiltrated film.

In some embodiments the contacting steps of the selective deposition process comprise a deposition cycle and the selective deposition process comprises one or more deposition cycles. In some embodiments the metallic material comprises a metal, metal alloy, metal oxide, metal nitride, metal carbide and/or combinations thereof. In some embodiments the infiltration process comprises alternately and sequentially exposing the selectively formed organic film to a first reactant comprising the metal and a second reactant. In some embodiments aluminum oxide ($Al_2O_3$) is incorporated into the selectively formed organic film. In some embodiments aluminum oxide ($Al_2O_3$) is incorporated into the selectively formed organic film, the first reactant comprises trimethylaluminum (TMA), and the second reactant comprises $H_2O$. In some embodiments titanium dioxide ($TiO_2$) is incorporated into the selectively formed organic film. In some embodiments the process may further comprise subjecting the selectively formed organic film to an ashing process removing carbon from the selectively formed organic film. In some embodiments the ashing process comprises exposing the selectively formed organic film to oxygen atoms, oxygen radicals, oxygen plasma, or combinations thereof. In some embodiments the infiltrated film has an increased resistance to an HF etch relative to the same film that has not been subjected to an infiltration process.

BRIEF DESCRIPTION OF THE DRAWINGS

FIG. 7A is a series of schematic cross sections generally illustrating a semiconductor device fabrication process including a block mask formed by selectively depositing an organic film on a first surface of a substrate relative to a second dielectric surface.

FIG. 7B is a series of plan views generally illustrating stages of the semiconductor fabrication process of FIG. 7A, including a block mask formed by selectively depositing an organic film on a first surface of a substrate relative to a second dielectric surface.

DETAILED DESCRIPTION

Figure 1:
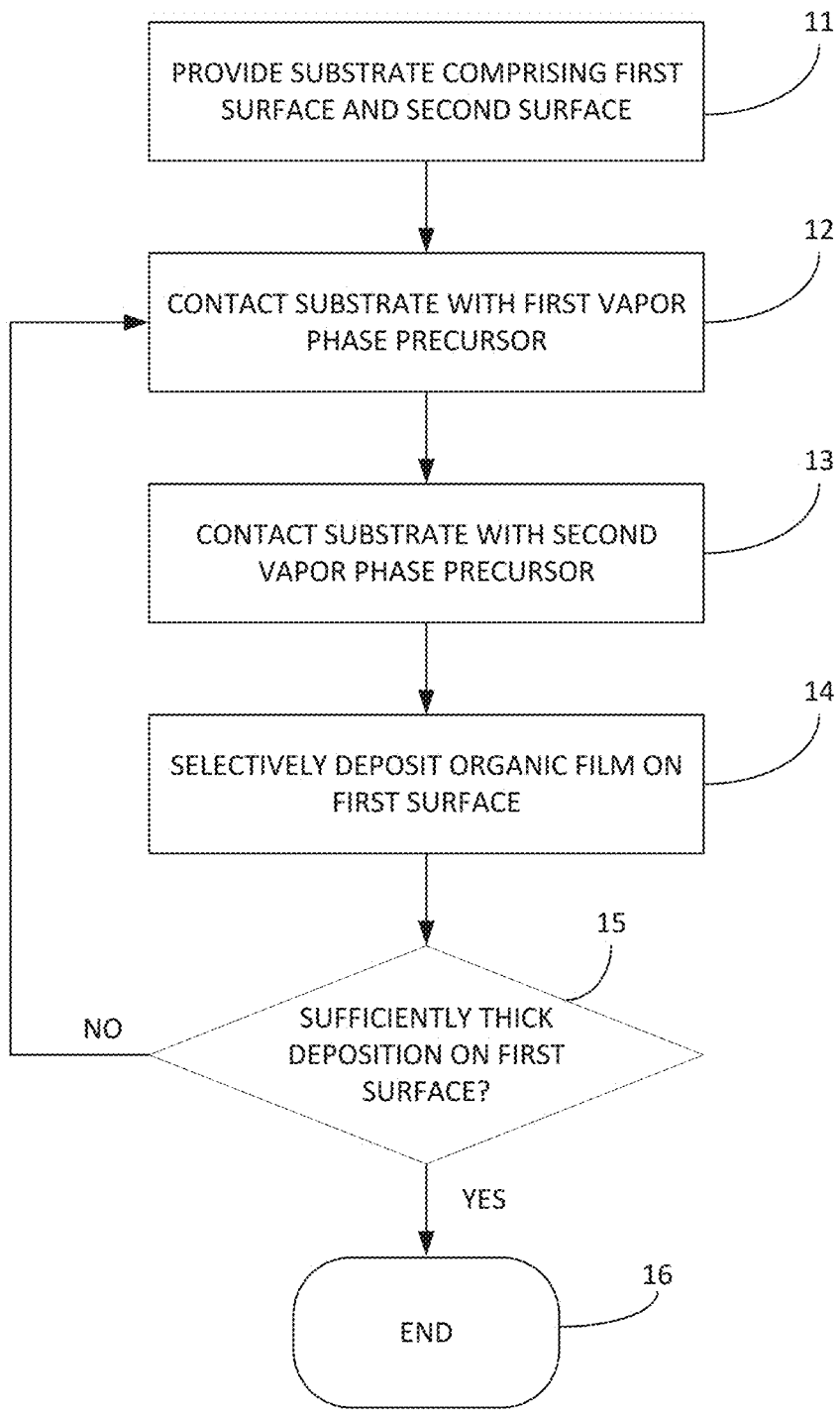
FIG. 1 is a flow diagram generally illustrating processes for selectively depositing an organic film.

According to some aspects of the present disclosure, selective deposition can be used to deposit an organic material on a first surface relative to a second surface. The two surfaces can have different material properties. In some embodiments an organic material is selectively deposited on a first conductive (e.g., metal or metallic) surface of a substrate relative to a second dielectric surface of the substrate. In some embodiments the second surface comprises —OH groups, such as a silicon oxide-based surface. In some embodiments the second surface may additionally comprise —H terminations, such as an HF dipped Si or HF dipped Ge surface. In such embodiments, the surface of interest will be considered to comprise both the —H terminations and the material beneath the —H terminations. In some embodiments an organic material such as a polyamide or polyimide is selectively deposited on a first dielectric surface of a substrate relative to a second, different dielectric surface. In some such embodiments, the dielectrics have different compositions (e.g., silicon, silicon nitride, carbon, silicon oxide, silicon oxynitride, germanium oxide). In other such embodiments, the dielectrics can have the same basic composition (e.g., silicon oxide-based layers) but different material properties due to the manner of formation (e.g., thermal oxides, native oxides, deposited oxides). In some embodiments vapor deposition methods are used. In some embodiments cyclical vapor deposition is used, for example, cyclical CVD or atomic layer deposition (ALD) processes are used. After selective deposition of the organic material is completed, further processing can be carried out to form the desired structures. Advantageously, selectivity can be achieved without passivation/blocking agents on the surface to receive less of the organic layer; and/or without catalytic agents on the surface to receive more of the organic layer.

For embodiments in which one surface comprises a metal whereas the other surface does not, unless otherwise indicated, if a surface is referred to as a metal surface herein, it may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments metal or a metallic surface comprises one or more transition metals. In some embodiments a metal or metallic surface comprises aluminum. In some embodiments the metal or metallic surface comprises one or more of Al, Cu, Co, Ni, W, Nb, Fe. In some embodiments a metallic surface comprises titanium nitride. In some embodiments the metal or metallic surface comprises one or more noble metals, such as Ru. In some embodiments the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $WNC_x$, TaN, or TiN.

In some embodiments the metal or metallic surface may comprise Zn, Fe, Mn, or Mo. In some embodiments the metal or metallic surface may be any surface that can accept or coordinate with the first or second precursor utilized in a selective deposition process as described herein.

In some embodiments an organic material is selectively deposited on a metal oxide surface relative to other surfaces. A metal oxide surface may be, for example a $WO_x$, $HfO_x$, $TiO_x$, $AlO_x$ or $ZrO_x$ surface. In some embodiments a metal oxide surface is an oxidized surface of a metallic material. In some embodiments a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments a metal oxide surface is a native oxide formed on a metallic material.

In some embodiments the first surface may comprise a passivated metal surface, for example a passivated Cu surface. That is, in some embodiments the first surface may comprise a metal surface comprising a passivation layer, for example an organic passivation layer such as a benzotriazole (BTA) layer.

In some embodiments an organic material is selectively deposited on a first dielectric surface relative to a second $SiO_2$ surface. In some embodiments an organic material is selectively deposited on a first dielectric surface relative to a second Si or Ge surface, for example an HF-dipped Si or HF-dipped Ge surface.

In some embodiments an organic material is selectively deposited on a first metal or metallic surface of a substrate relative to a second dielectric surface of the substrate. In some embodiments the organic material that is selectively deposited is a polyamide, polyimide, or other polymeric material. The term dielectric is used in the description herein for the sake of simplicity in distinguishing from the other surface, namely the metal or metallic surface. It will be understood by the skilled artisan that not all non-conducting surfaces are dielectric surfaces. For example, the metal or metallic surface may comprise an oxidized metal surface that is electrically non-conducting or has a very high resistivity. Selective deposition processes taught herein can deposit on such non-conductive metallic surfaces with minimal deposition on adjacent dielectric surfaces.

In some embodiments an organic material is selectively deposited on a first metal oxide surface of a substrate relative to a second $SiO_2$ surface. In some embodiment the first metal oxide surface may be, for example a $WO_x$, $HfO_x$, $TiO_x$, $AlO_x$ or $ZrO_x$ surface. In some embodiments the organic material is deposited on a first dielectric surface relative to a second $SiO_2$ surface. In some embodiments the second $SiO_2$ surface may be, for example, a native oxide, a thermal oxide or a chemical oxide. In some embodiments an organic material is selectively deposited on a first metal oxide surface relative to a second Si or Ge surface, for example an HF-dipped Si or HF-dipped Ge surface.

In some embodiments a substrate is provided comprising a first metal or metallic surface and a second dielectric surface. In some embodiments a substrate is provided that comprises a first metal oxide surface. In some embodiments the second surface may comprise —OH groups. In some embodiments the second surface may be a $SiO_2$ based surface. In some embodiments the second surface may comprise Si—O bonds. In some embodiments the second surface may comprise a $SiO_2$ based low-k material. In some embodiments the second surface may comprise more than about 30%, or more than about 50% of $SiO_2$. In some embodiments the second surface may comprise $GeO_2$. In some embodiments the second surface may comprise Ge—O bonds. In some embodiments an organic material is selectively deposited on a first metal or metallic surface relative to a second Si or Ge surface, for example an HF-dipped Si or HF-dipped Ge surface.

In certain embodiments the first surface may comprise a silicon dioxide surface and the second dielectric surface may comprise a second, different silicon dioxide surface. For example, in some embodiments the first surface may comprise a naturally or chemically grown silicon dioxide surface. In some embodiments the second surface may comprise a thermally grown silicon dioxide surface. In other embodiments, the first or the second surface may be replaced with a deposited silicon oxide layer. Therefore, in some embodiments organic material may be selectively deposited on a first silicon dioxide surface of a substrate relative to a second silicon dioxide surface that was formed by a different technique and therefore has different material properties.

In some embodiments the substrate may be pretreated or cleaned prior to or at the beginning of the selective deposition process. In some embodiments the substrate may be subjected to a plasma cleaning process at prior to or at the beginning of the selective deposition process. In some embodiments a plasma cleaning process may not include ion bombardment, or may include relatively small amounts of ion bombardment. For example, in some embodiments the substrate surface may be exposed to plasma, radicals, excited species, and/or atomic species prior to or at the beginning of the selective deposition process. In some embodiments the substrate surface may be exposed to hydrogen plasma, radicals, or atomic species prior to or at the beginning of the selective deposition process. In some embodiments a pretreatment or cleaning process may be carried out in the same reaction chamber as a selective deposition process, however in some embodiments a pretreatment or cleaning process may be carried out in a separate reaction chamber.

The term "about" is employed herein to mean within standard measurement accuracy.

Selective deposition using the methods described herein can advantageously be achieved without treatment of the second dielectric surface to block deposition thereon and/or without treatment of the first surface (whether metallic or a different dielectric surface) to catalyze deposition. As a result, in some embodiments the second dielectric surface does not comprise a passivation or blocking layer, such as a self-assembled monolayer (SAM), which would prevent the actual top surface of the second dielectric surface from being exposed to the chemicals of the deposition processes described herein. Thus, in some embodiments selectivity is achieved despite the lack of blocking or catalyzing agents, and both first and second surfaces are directly exposed to the deposition reactants.

Vapor phase deposition techniques can be applied to organic films and polymers such as polyimide films, polyamide films, polyurea films, polyurethane films, polythiophene films, and more. CVD of polymer films can produce greater thickness control, mechanical flexibility, conformal coverage, and biocompatibility as compared to the application of liquid precursor. Sequential deposition processing of polymers can produce high growth rates in small research scale reactors. Similar to CVD, sequential deposition processes can produce greater thickness control, mechanical flexibility, and conformality. The terms "sequential deposition" and "cyclical deposition" are employed herein to apply to processes in which the substrate is alternately or sequentially exposed to different precursors, regardless of whether the reaction mechanisms resemble ALD, CVD, MLD or hybrids thereof.

In some embodiments the processes described herein may be batch processes, that is, the processes may be carried out on two or more substrates at the same time. In some embodiments the processes described herein may be carried out on two or more, five or more, 10 or more, 25 or more, 50 or more, or 100 or more substrates at the same time. In some embodiments the substrate may comprise wafers, for example, semiconductor or silicon wafers. In some embodiments the substrates may have diameters of 100 mm or more, 200 mm or more, or 300 mm or more. In some instances substrates having diameters of 450 mm or more may be desirable.

Selectivity

Selectivity can be given as a percentage calculated by [(deposition on first surface)−(deposition on second surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition. Surprisingly, selectivity has been found to increase with the duration of the deposition for the vapor phase polymer film depositions described herein. In contrast, typical selective deposition based on differential nucleation on different surfaces tends to become less selective with greater duration or thickness of a deposition.

In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

In some embodiments the organic film deposited on the first surface of the substrate may have a thickness less than about 50 nm, less than about 20 nm, less than about 10 nm, less than about 5 nm, less than about 3 nm, less than about 2 nm, or less than about 1 nm, while a ratio of material deposited on the first surface of the substrate relative to the second surface of the substrate may be greater than or equal to about 2:1, greater than or equal to about 20:1, greater than or equal to about 15:1, greater than or equal to about 10:1, greater than or equal to about 5:1, greater than or equal to about 3:1, or greater than or equal to about 2:1.

In some embodiments the selectivity of the selective deposition processes described herein may depend on the materials which comprise the first and/or second surface of the substrate. For example, in some embodiments where the first surface comprises a BTA passivated Cu surface and the second surface comprises a natural or chemical silicon dioxide surface the selectivity may be greater than about 8:1 or greater than about 15:1. In some embodiments where the first surface comprises a metal or metal oxide and the second surface comprises a natural or chemical silicon dioxide surface the selectivity may be greater than about 5:1 or greater than about 10:1. In some embodiments where the first surface comprises a chemical or natural silicon dioxide surface and the second surface comprises a thermal silicon dioxide surface the selectivity may be greater than about 5:1 or greater than about 10:1. In some embodiments where the first surface comprises natural or chemical silicon dioxide, and the second surface comprises Si—H terminations, for example an HF dipped Si surface, the selectivity may be greater than about 5:1 or greater than about 10:1. In some embodiments where the first surface comprises Si—H terminations, for example an HF dipped Si surface, and the second surface comprises thermal silicon dioxide, the selectivity may be greater than about 5:1 or greater than about 10:1.

Selective Deposition

Deposition processes taught herein can achieve high growth rate and throughput, and can produce high quality organic thin films.

In some embodiments, a substrate comprising a first surface and a second surface is provided. The first and second surfaces may have different material properties. In some embodiments the first surface may be a metallic surface and the second surface may be a dielectric surface. In some embodiments a first organic reactant is vaporized to form a first reactant vapor. The reactant being vaporized may be liquid or solid under standard temperature and pressure conditions (room temperature and atmospheric pressure). In some embodiments, the reactant being vaporized comprises an organic precursor, such as an amine, for example a diamine, such as 1,6-diamnohexane (DAH), or another organic precursor, such as a dianhydride, for example pyromellitic dianhydride (PMDA). The substrate is then exposed to the first reactant vapor and an organic film deposited. The method can include additional steps, and may be repeated, but need not be performed in the illustrated sequence nor the same sequence in each repetition if repeated, and can be readily extended to more complex vapor deposition techniques.

In some embodiments, the organic film comprises a polymer. In some embodiments, the polymer deposited is a polyimide. In some embodiments, the polymer deposited is a polyamide. Other examples of deposited polymers include dimers, trimers, polyurethanes, polythioureas, polyesters, polyimines, other polymeric forms or mixtures of the above materials.

The techniques taught herein can be applied to vapor deposition techniques, including CVD, VPD, ALD, and MLD in a wide variety of reactor configurations.

Referring to FIG. 1 and in some embodiments, a substrate comprising a first surface and a second surface is provided at block 11. The first and second surfaces may have different material properties. In some embodiments the first surface may be a conductive surface, for example a metal or metallic surface, and the second surface may be a dielectric surface. In some embodiments the first surface may be a dielectric surface and the second surface may be a second, different dielectric surface. In some embodiments the first and second surfaces may have the same basic composition, but may have different material properties due to different manners of formation (e.g., thermal oxide, deposited oxide, native oxide).

In some embodiments the first precursor may be vaporized at a first temperature to form the first vapor phase precursor. In some embodiments the first precursor vapor is transported to the substrate through a gas line at a second temperature. In some embodiments the second transportation temperature is higher than the first vaporization temperature. In some embodiments the substrate is contacted with a first vapor phase precursor, or reactant, at block 12 for a first exposure period. In some embodiments the substrate may be contacted with the first vapor phase precursor at a third temperature that is higher than the first temperature.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments the substrate is contacted with a second vapor phase precursor, or reactant, at block 13 for a second exposure period. In some embodiments the second precursor may be vaporized at a fourth temperature to form the second vapor phase precursor. In some embodiments the second reactant vapor is transported to the substrate through a gas line at a second temperature. In some embodiments the fifth transportation temperature is higher than the first vaporization temperature. In some embodiments the substrate may be contacted with the second vapor phase precursor at a sixth temperature that is higher than the fourth temperature. In some embodiments the sixth temperature may be substantially the same as the third temperature at which the first vapor phase precursor contacts the substrate.

In some embodiments the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In block 14 an organic film is selectively deposited on the first surface relative to the second surface. The skilled artisan will appreciate that selective deposition of an organic film is the result of the above-described contacting actions, 12-13, rather than a separate action. In some embodiments, the above-described contacting actions, blocks 12-13, may be considered a deposition cycle. In some embodiments a deposition cycle may repeated until an organic film of a desired thickness is selectively deposited. Such a selective deposition cycle can be repeated until a film of sufficient thickness is left on the substrate (block 15) and the deposition is ended (block 16). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal (relative to the substrate) of additional reactants in each cycle or in selected cycles. Though not shown, the process may additionally comprise treating the deposited film to form a polymer (for example, UV treatment, annealing, etc.).

Figure 2:
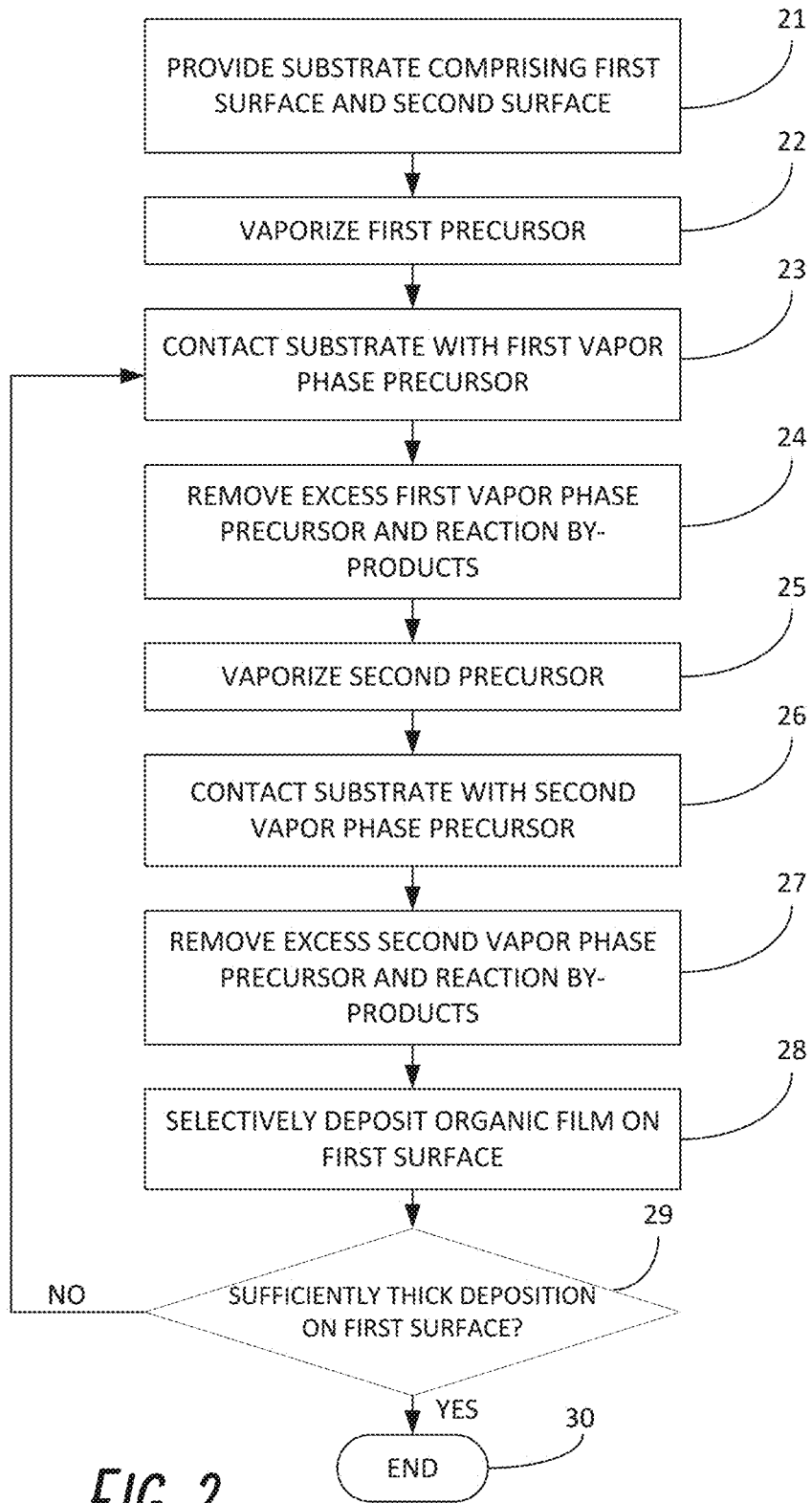
FIG. 2 is a flow diagram generally illustrating atomic layer deposition (ALD) processes for selectively depositing an organic film.

Referring to FIG. 2 and in some embodiments, a substrate comprising a first surface and a second surface is provided at block 21. The first and second surfaces may have different material properties. In some embodiments the first surface may be a conductive surface, for example a metal or metallic surface, and the second surface may be a dielectric surface. In some embodiments the first surface may be a dielectric surface and the second surface may be a second, different dielectric surface. In some embodiments the first and second surfaces may have the same basic composition, but may have different material properties due to different manners of formation (e.g., thermal oxide, deposited oxide, native oxide).

In some embodiments a sequential deposition method for selective vapor deposition of an organic film comprises vaporizing a first organic precursor is at a first temperature to form a first precursor vapor at block 22. In some embodiments the first precursor vapor is transported to the substrate through a gas line at a second temperature. In some embodiments the second transportation temperature is higher than the first vaporization temperature. In some embodiments the substrate is contacted with the vapor phase first precursor for a first exposure period at block 23. In some embodiments, the first precursor, or species thereof, chemically adsorbs on the substrate in a self-saturating or self-limiting fashion. The gas line can be any conduit that transports the first precursor vapor from the source to the substrate. In some embodiments, the substrate may be exposed to the first precursor vapor at a third temperature that is higher than the first temperature.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

Excess of the first precursor vapor (and any volatile reaction by-products) may then be removed from contact with the substrate at block 24. Such removal can be accomplished by, for example, purging, pump down, moving the substrate away from a chamber or zone in which it is exposed to the first reactant, or combinations thereof. In some embodiments a first precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments where batch reactors may be used, removal periods of greater than 60 seconds may be employed.

In some embodiments the second precursor may be vaporized at a fourth temperature to form the second vapor phase precursor at block 25. In some embodiments the second reactant vapor is transported to the substrate through a gas line at a second temperature. In some embodiments the fifth transportation temperature is higher than the first vaporization temperature. In some embodiments the substrate may be contacted with the second vapor phase precursor at a sixth temperature that is higher than the fourth temperature. In some embodiments the sixth temperature may be substantially the same as the third temperature at which the first vapor phase precursor contacts the substrate. In some embodiments the substrate may exposed to a second precursor vapor for a second exposure period at block 26. In some embodiments, the second reactant may react with the adsorbed species of the first reactant on the substrate.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments excess of the second precursor vapor (and any volatile reaction by-product) is removed from contact with the substrate at block 27, such that the first reactant vapor and the second reactant vapor do not mix. In some embodiments the vapor deposition process of the organic film does not employ plasma and/or radicals, and can be considered a thermal vapor deposition process. In some embodiments a second precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments where batch reactors may be used, removal periods of greater than 60 seconds may be employed.

In block 28 an organic film is selectively deposited on the first surface relative to the second surface. The skilled artisan will appreciate that selective deposition of an organic film is the result of the above-described contacting actions rather than a separate action. In some embodiments, the above-described contacting and removing (and/or halting supply) actions, blocks 23-27, may be considered a deposition cycle. In some embodiments a deposition cycle may repeated until an organic film of a desired thickness is selectively deposited. Such a selective deposition cycle can be repeated (block 29) until a film of sufficient thickness is left on the substrate and the deposition is ended (block 30). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal of additional reactants in each cycle or in selected cycles. Though not shown, the process may additionally comprise treating the deposited film to form a polymer (for example, UV treatment, annealing, etc.).

Figure 3:
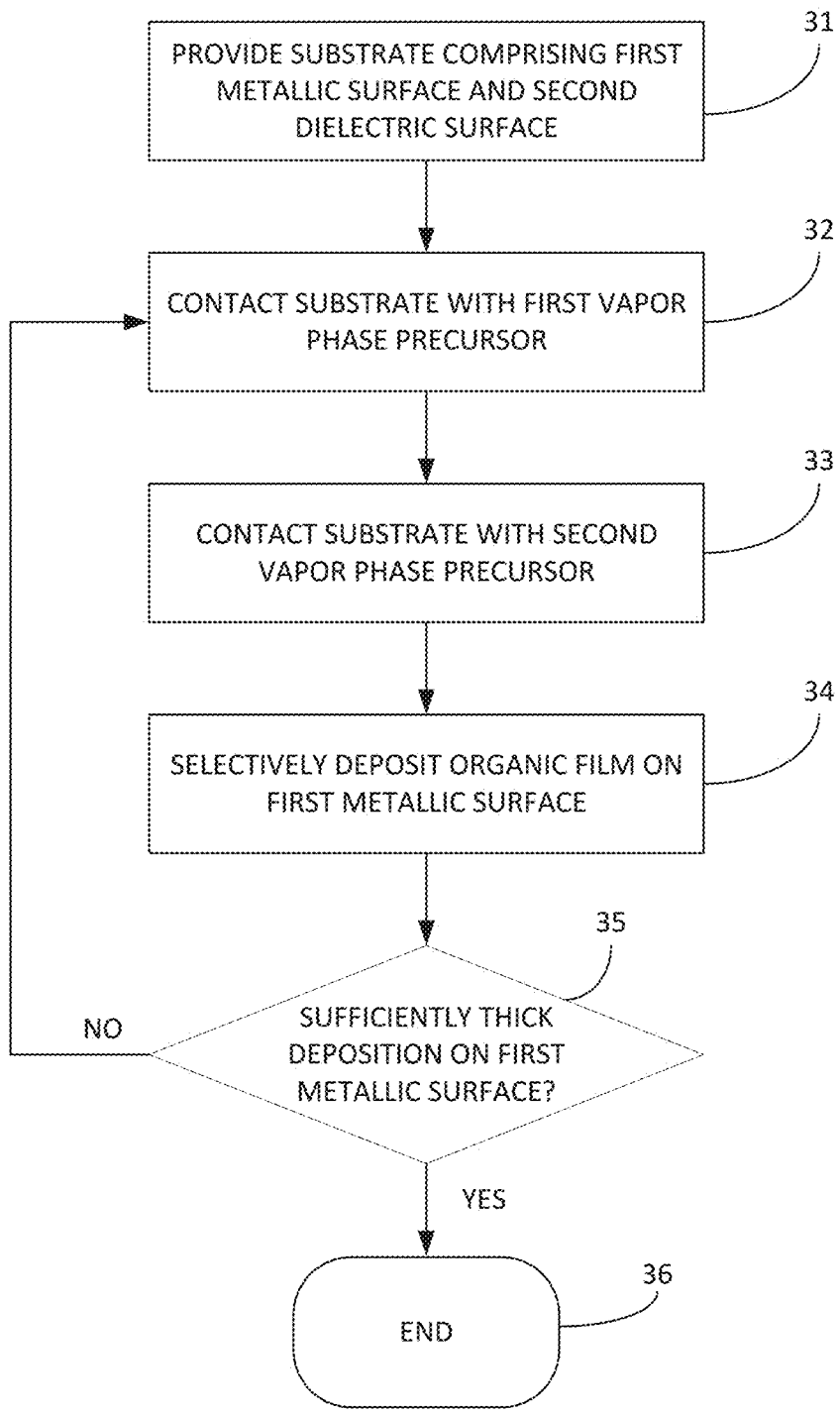
FIG. 3 is a flow diagram generally illustrating processes for selectively depositing an organic film on a first metallic surface of a substrate relative to a second dielectric surface.

Referring to FIG. 3, and in some embodiments, a substrate comprising a first metal or metallic surface and a second dielectric surface is provided at block 31. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments the first surface may comprise a passivated metal surface, for example a passivated Cu surface.

In some embodiments the second dielectric surface may comprise silicon oxide. The term dielectric is used herein for the sake of simplicity in distinguishing from the other surface, namely the metal or metallic surface. Unless indicated otherwise with respect to particular embodiments, the term dielectric in the context of this application can be understood to cover all surfaces which are electrically non-conducting or have very high resistivity. In some embodiments the second surface may comprise —OH groups. In some embodiments the second surface may be a $SiO_2$ based surface. In some embodiments the second surface may comprise Si—O bonds. In some embodiments the second surface may comprise a $SiO_2$ based low-k material. In some embodiments the second surface may comprise more than about 30%, or more than about 50% of $SiO_2$. In some embodiments the second surface may comprise $GeO_2$. In some embodiments the second surface may comprise Ge—O or Ge—OH bonds.

In some embodiments the first precursor may be vaporized at a first temperature to form the first vapor phase precursor. In some embodiments the first precursor vapor is transported to the substrate through a gas line at a second temperature. In some embodiments the second transportation temperature is higher than the first vaporization temperature. In some embodiments the substrate is contacted with a first vapor phase precursor, or reactant, at block 32 for a first exposure period. In some embodiments the substrate may be contacted with the first vapor phase precursor at a third temperature that is higher than the first temperature.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments the substrate is contacted with a second vapor phase precursor, or reactant, at block 33 for a second exposure period. In some embodiments the second precursor may be vaporized at a fourth temperature to form the second vapor phase precursor. In some embodiments the second reactant vapor is transported to the substrate through a gas line at a second temperature. In some embodiments the fifth transportation temperature is higher than the first vaporization temperature. In some embodiments the substrate may be contacted with the second vapor phase precursor at a sixth temperature that is higher than the fourth temperature. In some embodiments the sixth temperature may be substantially the same as the third temperature at which the first vapor phase precursor contacts the substrate.

In some embodiments the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In block 34 an organic film is selectively deposited on the first metallic surface relative to the second dielectric surface. The skilled artisan will appreciate that selective deposition of an organic film is the result of the above-described contacting actions rather than a separate action. In some embodiments, the above-described contacting actions, blocks 32-33, may be considered a deposition cycle. In some embodiments a deposition cycle may repeated until an organic film of a desired thickness is selectively deposited on the first metallic surface of the substrate relative to the second dielectric surface. Such a selective deposition cycle can be repeated until a film of sufficient thickness is left on the first metallic surface of the substrate (block 35) and the deposition is ended (block 36). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal of additional reactants in each cycle or in selected cycles. Though not shown, the process may additionally comprise treating the deposited film to form a polymer (for example, UV treatment, annealing, etc.).

Various reactants can be used for the above described processes. For example, in some embodiments, the first precursor or reactant is an organic reactant such as a diamine, e.g., 1,6-diamnohexane (DAH), or any other monomer with two reactive groups.

In some embodiments, the second reactant or precursor is also an organic reactant capable of reacting with adsorbed species of the first reactant under the deposition conditions. For example, the second reactant can be an anhydride, such as furan-2,5-dione (maleic acid anhydride), or more particularly a dianhydride, e.g., pyromellitic dianhydride (PMDA), or any other monomer with two reactive groups which will react with the first reactant.

In some embodiments the substrate is contacted with the first precursor prior to being contacted with the second precursor. Thus, in some embodiments the substrate is contacted with an amine, such as a diamine, for example 1,6-diamnohexane (DAH) prior to being contacted with another precursor. However, in some embodiments the substrate may be contacted with the second precursor prior to being contacted with the first precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

Although the above described processes begin with contacting the substrate with the first vapor phase precursor, in other embodiments a process may begin with contacting the substrate with the second vapor phase precursor. It will be understood by the skilled artisan that contacted the substrate with the first precursor and second precursor are interchangeable in the processes described herein.

In some embodiments, different reactants can be used to tune the film properties. For example, a polyimide film could be deposited using 4,4'-oxydianiline or 1,4-diaminobenzene instead of 1,6-diaminohexane to get a more rigid structure with more aromaticity and increased dry etch resistance.

In some embodiments the reactants do not contain metal atoms. In some embodiments the reactants do not contain semimetal atoms. In some embodiments one of the reactants comprises metal or semimetal atoms. In some embodiments the reactants contain carbon and hydrogen and one or more of the following elements: N, O, S, P or a halide, such as Cl or F. In some embodiments the first reactant may comprise, for example, adipoyl chloride (AC).

Deposition conditions can differ depending upon the selected reactants and can be optimized upon selection. In some embodiments the reaction temperature can be selected from the range of about 80° C. to about 250° C. In some embodiments, for example where the selectively deposited organic film comprises polyimide, the reaction temperature can be selected from the range of about 170° C. to about 210° C. In some embodiments, for example where the selectively deposited organic film comprises polyamide, the reaction temperature can be selected from a range of about 80° C. to about 150° C. In some embodiments where the selectively deposited organic film comprises polyimide the reaction temperature may be greater than about 160° C., 180° C., 190° C., 200° C., or 210° C. In some embodiments where the selectively deposited organic film comprises polyamide the reaction temperature may be greater than about 80° C., 90° C., 100° C., 110° C., 120° C., 130° C., 140° C., or 150° C.

In some embodiments the reaction chamber pressure may be from about 1 mTorr to about 1000 Torr.

For example, for sequential deposition of polyimide using PMDA and DAH in a single wafer deposition tool, substrate temperatures can be selected from the range of about 150° C. to about 250° C., or from about 170° C. to about 210° C., and pressures can be selected from the range of about 1 mTorr to about 760 Torr, more particularly between about 100 mTorr to about 100 Torr.

In some embodiments the selectively deposited or formed organic film does not contain metal atoms. In some embodiments the selectively deposited or formed organic film does not contain semimetal atoms. In some embodiments the selectively deposited or formed organic film contains metal or semimetal atoms. In some embodiments the selectively deposited or formed organic film contains carbon and hydrogen and one or more of the following elements: N, O, S, or P.

Examples of suitable reactors that may be used in the selective deposition processes described herein include commercially available ALD equipment such as the F-120® reactor, Pulsar® reactor, such as a Pulsar 3000® or Pulsar 2000®, and Advance® 400 Series reactor, available from ASM America, Inc. of Phoenix, Ariz. and ASM Europe B. V., Almere, Netherlands. In addition to these ALD reactors, many other kinds of reactors capable growth of organic thin films, including CVD reactors, VDP reactors, and MLD reactors can be employed.

In some embodiments a suitable reactor may be a batch reactor and may contain two or more substrates. In some embodiments the substrate may comprise, for example, wafers. In some embodiments a suitable reactor may be a batch reactor that may contain two or more, five or more, 10 or more, 25 or more, 50 or more, or 100 or more substrates. In some embodiments the substrate may comprise wafers, for example, semiconductor or silicon wafers. In some embodiments the substrates may have diameters of 100 mm or more, 200 mm or more, or 300 mm or more. In some instances, substrates having diameters of 450 mm or more may be desirable.

In some embodiments the first surface (e.g., metallic surface) of a substrate onto which an organic film is to be selectively deposited may comprise a structure on a semiconductor substrate or integrated circuit workpiece. In some embodiments the first surface of the substrate may comprise one or more metal lines or dots. For example, the first surface of the substrate may comprise a W, Co, or Cu line while the second surface may comprise a silicon oxide-based material. That is, in some embodiments the substrate may comprise at least a first portion of the first metallic surface and a second portion of the first metallic surface, wherein the first and second portions of the first metallic surface are separated on the substrate by the second dielectric surface.

In some embodiments, the selectivity of the selective deposition processes described herein may change based on the dimensions or pitch of the portions of the first surface onto which the organic film is selectively deposited. In some embodiments the selectivity of the selective deposition processes described herein may increase as the pitch of the features comprising first surface increases. Increased pitch is used herein as conventional in the semiconductor industry to mean greater number of features in a given dimension, or greater density and closer spacing between features.

In some embodiments a selective deposition process can achieve a desired selectivity on a substrate wherein the periodicity of features comprising the first surface is less than about 1 micron, less than about 500 nm, less than about 250 nm, or less than about 100 nm. In some embodiments the periodicity of features comprising the first surface is less than 40 nm, or even less than 20 nm. As used herein, periodicity refers to the distance between the two nearest repeated structures, materials, or surfaces on a substrate. In some embodiments the selectivity of a selective deposition process may depend on the distance between a first portion of the substrate comprising a first surface and a second portion of the substrate comprising a first surface, such as the aforementioned periodicity for repeating patterns on a substrate. In some embodiments the selectivity of the selective deposition processes described herein may increase as the distance between the portions of the first material decreases.

In some embodiments a selective deposition process can achieve a desired selectivity on a substrate comprising a first portion of the first surface separated by a distance from a second portion of the first surface. In some embodiments the desired selectivity may be achieved when the distance between the first and second portions of the first surface is less than about 1 micron, less than about 500 nm, less than about 250 nm, or less than about 100 nm.

In some embodiments the selectivity of a selective deposition process may be related to the number of growth, or deposition cycles performed in the selective deposition process. In some embodiments the selectivity for a selective deposition process may increase with the number of deposition cycles. For example, the selectivity of a selective deposition process comprising 250 of deposition cycles may be less than the selectivity of a selective deposition process comprising 1000 deposition cycles where the conditions for the deposition cycles in each process are substantially the same. This is surprising, given that typical selective vapor deposition processes tend to lose selectivity with greater thickness or deposition duration.

In some embodiments an increase in the number of deposition cycles in a selective deposition process may result in a corresponding increase in the selectivity of the process. For example, in some embodiments doubling the number of deposition cycles may result in selective deposition process which is twice as selective, as will be understood from the example of FIG. 8.

Although generally a deposition or reaction temperature for the selective deposition processes described herein is greater than or equal to the vaporization temperatures of the first and second reactants, in some other embodiments the reaction temperature may be lower than one or both of the reactant vaporization temperatures.

Precursors

Various reactants can be used to deposit polyamide or polyimide films according to the processes described herein. For example, in some embodiments the first precursor or reactant is an amine, for example a diamine. In some embodiments the first reactant can be, for example, 1,6-diamnohexane (DAH). In some embodiments the substrate is contacted with the first precursor before it is contacted with the second precursor. Thus, in some embodiments the substrate may be contacted with an amine, such as a diamine, before it is contacted with a second precursor.

In some embodiments, the second reactant or precursor is also an organic reactant capable of reacting with adsorbed species of the first reactant under the deposition conditions. For example, in some embodiments, the second precursor or reactant is an organic reactant such as an anhydride, such as furan-2,5-dione (maleic acid anhydride). The anhydride can be a dianhydride, e.g., pyromellitic dianhydride (PMDA). In some embodiments the second reactant can be any other monomer with two reactive groups which will react with the first reactant.

In some embodiments the reactants do not contain metal atoms. In some embodiments the reactants do not contain semimetal atoms. In some embodiments one of the reactants comprises metal or semimetal atoms. In some embodiments the reactants contain carbon and hydrogen and one or more of the following elements: N, O, S, P or a halide, such as Cl or F. In some embodiments the first reactant may comprise, for example, adipoyl chloride (AC).

In some embodiments reactants for use in the selective deposition processes described herein may have the general formula:

$$R^1(NH_2)_2 \quad (1)$$

Wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments the bonds between carbon atoms in the reactant or precursor may be single bonds, double bonds, triple bonds, or some combination thereof. Thus, in some embodiments a reactant may comprise two amino groups. In some embodiments the amino groups of a reactant may occupy one or both terminal positions on an aliphatic carbon chain. However, in some embodiments the amino groups of a reactant may not occupy either terminal position on an aliphatic carbon chain. In some embodiments a reactant may comprise a diamine. In some embodiments a reactant may comprise an organic precursor selected from the group of 1,2-diaminoethane (l), 1,3-diaminopropane (l), 1,4-diaminobutane(l), 1,5-diaminopentane (l), 1,2-diaminopropane (l), 2,3-butanediamine, 2,2-dimethyl-1,3-propanediamine (l).

In some embodiments reactants for use in the selective deposition processes described herein may have the general formula:

$$R^2(COCl)_2 \quad (2)$$

Wherein $R^2$ may be an aliphatic carbon chain comprising 1-3 carbon atoms, 2-3 carbon atoms, or 3 or fewer carbon atoms. In some embodiments the bonds between carbon atoms in the reactant or precursor may be single bonds, double bonds, triple bonds, or some combination thereof. In some embodiments a reactant may comprise a chloride. In some embodiments a reactant may comprise a diacyl chloride. In some embodiments a reactant may comprise an organic precursor selected from the group of oxalyl chloride (I), malonyl chloride, and fumaryl chloride.

In some embodiments, a reactant comprises an organic precursor selected from the group of 1,4-diisocyanatobutane or 1,4-diisocyanatobenzene. In some embodiments a reactant comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene or terephthalaldehyde. In some embodiments, a reactant being vaporized can be also a diamine, such as 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments a reactant can be a carboxylic acid, for example alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

In some embodiments a reactant may have a vapor pressure greater than about 0.5 Torr, 0.1 Torr, 0.2 Torr, 0.5 Torr, 1 Torr or greater at a temperature of about 20° C. or room temperature. In some embodiments a reactant may have a boiling point less than about 400° C., less than 300° C., less than about 250° C., less than about 200° C., less than about 175° C., less than about 150° C., or less than about 100° C.

Polyamide Deposition

In some embodiments deposition processes taught herein may comprise deposition of a polyamide thin film. In some embodiments such a deposition process may comprise a vapor deposition process. In some embodiments such a deposition process may comprise a molecular layer deposition (MLD) process. In some embodiments such deposition processes may be a selective deposition process. However, in some embodiments such a deposition processes may be a nonselective deposition process. In some embodiments a first organic reactant is vaporized to form a first precursor vapor. The reactant being vaporized may be liquid or solid under standard temperature and pressure conditions (room temperature and atmospheric pressure). In some embodiments, the first reactant being vaporized comprises an organic precursor, such as an organochloride, for example adipoyl chloride (AC). In some embodiments a reactant may comprise an organic precursor selected from the group of oxalyl chloride (I), malonyl chloride, and fumaryl chloride.

In some embodiments the first precursor may be vaporized at a first temperature to form the first vapor phase precursor. In some embodiments the first precursor vapor is transported to the substrate through a gas line at a second temperature. In some embodiments the second transportation temperature is higher than the first vaporization temperature. In some embodiments the substrate is contacted with a first vapor phase precursor, or reactant, for a first exposure period. In some embodiments the substrate may be contacted with the first vapor phase precursor at a third temperature that is higher than the first temperature.

In some embodiments the first precursor exposure period is from about 0.05 seconds to about 5.0 seconds, about 0.1 seconds to about 3 seconds or about 0.2 seconds to about 1.0 seconds. The optimum exposure period can be readily determined by the skilled artisan based on the particular circumstances.

In some embodiments a second organic reactant is vaporized to form a second precursor vapor. The reactant being vaporized may be liquid or solid under standard temperature and pressure conditions (room temperature and atmospheric pressure). In some embodiments, the reactant being vaporized comprises an organic precursor, such as an organic amine, for example ethylene diamine (EDA). In some embodiments a reactant may comprise an organic precursor selected from the group of 1,2-diaminoethane (l), 1,3-diaminopropane (l), 1,4-diaminobutane(l), 1,5-diaminopentane (l), 1,2-diaminopropane (l), 2,3-butanediamine, 2,2-dimethyl-1,3-propanediamine (l).

In some embodiments the substrate is contacted with a second vapor phase precursor, or reactant, for a second exposure period. In some embodiments the second precursor may be vaporized at a fourth temperature to form the second vapor phase precursor. In some embodiments the second reactant vapor is transported to the substrate through a gas line at a second temperature. In some embodiments the fifth transportation temperature is higher than the first vaporization temperature. In some embodiments the substrate may be contacted with the second vapor phase precursor at a sixth temperature that is higher than the fourth temperature. In some embodiments the sixth temperature may be substantially the same as the third temperature at which the first vapor phase precursor contacts the substrate.

In some embodiments the second precursor exposure period is from about 0.05 seconds to about 5.0 seconds, about 0.1 seconds to about 3 seconds or about 0.2 seconds to about 1.0 seconds. The optimum exposure period can be readily determined by the skilled artisan based on the particular circumstances.

In some embodiments a polyamide film of a desired thickness is deposited on a substrate. The skilled artisan will appreciate that deposition of a polyamide film is the result of the above-described contacting actions, rather than a separate action. In some embodiments, the above-described contacting actions may be considered a deposition cycle. In some embodiments a deposition cycle may repeated until an organic film of a desired thickness is selectively deposited. Such a deposition cycle can be repeated until a film of sufficient thickness is left on the substrate and the deposition is ended. The deposition cycle can include additional acts, need not be in the same sequence nor identically performed in each repetition, and can be readily extended to more complex vapor deposition techniques. For example, a deposition cycle can include additional reactant supply processes, such as the supply and removal (relative to the substrate) of additional reactants in each cycle or in selected cycles. Though not shown, the process may additionally comprise treating the deposited film to form a polymer (for example, UV treatment, annealing, etc.).

Subsequent Processing

In some embodiments further processing may be carried out subsequent to an organic film deposition process, such as a selective deposition process as described herein. For example, in some embodiments the substrate may be subjected to an etch process to remove at least a portion of the deposited organic film. In some embodiments an etch process subsequent to selective deposition of the organic film may remove deposited organic material from both the first surface and the second surface of the substrate. In some embodiments the etch process may be isotropic.

In some embodiments the etch process may remove the same amount, or thickness, of material from the first and second surfaces. That is, in some embodiments the etch rate of the organic material deposited on the first surface may be substantially similar to the etch rate of the organic material deposited on the second surface. Due to the selective nature of the deposition processes described herein, the amount of organic material deposited on the second surface of the substrate may be substantially less than the amount of material deposited on the first surface of the substrate. Therefore, an etch process may completely remove deposited organic material from the second surface of the substrate while deposited organic material may remain on the first surface of the substrate.

In some embodiments the etch process may comprise an etch process known in the art, for example a dry etch process such as a plasma etch process. In some embodiments the etch process may comprise exposing the substrate to hydrogen atoms, hydrogen radicals, hydrogen plasma, or combinations thereof. For example, in some embodiments the etch process may comprise exposing the substrate to a plasma generated from $H_2$ using a power from about 10 W to about 5000 W, from about 25 W to about 2500 W, from about 50 W to about 500 W, or from about 100 W to about 400 W. In some embodiments the etch process may comprise exposing the substrate to a plasma generated using a power from about 1 W to about 1000 W, from about 10 W to about 500 W, from about 20 W to about 250 W, or from about 25 W to about 100 W.

In some embodiments the etch process may comprise exposing the substrate to a plasma. In some embodiments the plasma may comprise reactive species such as oxygen atoms, oxygen radicals, oxygen plasma, or combinations thereof. In some embodiments the plasma may comprise reactive species such as hydrogen atoms, hydrogen radicals, hydrogen plasma, or combinations thereof. In some embodiments the plasma may also comprise noble gas species in addition to reactive species, for example Ar or He species. In some embodiments the plasma may comprise noble gas species without reactive species. In some instances, the plasma may comprise other species, for example nitrogen atoms, nitrogen radicals, nitrogen plasma, or combinations thereof. In some embodiments the etch process may comprise exposing the substrate to an etchant comprising oxygen, for example $O_3$. In some embodiments the substrate may be exposed to an etchant at a temperature of between about 30° C. and about 500° C., or between about 100° C. and about 400° C. In some embodiments the etchant may be supplied in one continuous pulse or may be supplied in multiple shorter pulses.

A skilled artisan can readily determine the optimal exposure time, temperature, and power for removing the desired amount of deposited organic material from the substrate.

In some embodiments further processing of an organic film, for example a selectively deposited organic film as described herein, may comprise subjecting the organic film to an infiltration process. In some embodiments an infiltration process may insert, incorporate, or infuse inorganic material, for example a metal, into the organic film. The infiltration process may incorporate an elemental metal, multiple metals, metal alloy, metal oxide, metal nitride, metal carbide, or combinations thereof into the organic film. In some embodiments an infiltration process, also referred to as sequential infiltration synthesis, may be conducted after a selective deposition process has been used to selectively deposit an organic film on a first surface of a substrate relative to a second dielectric surface. An organic film which has been subjected to an infiltration process may be referred to herein as an infiltrated organic film.

Figure 4:
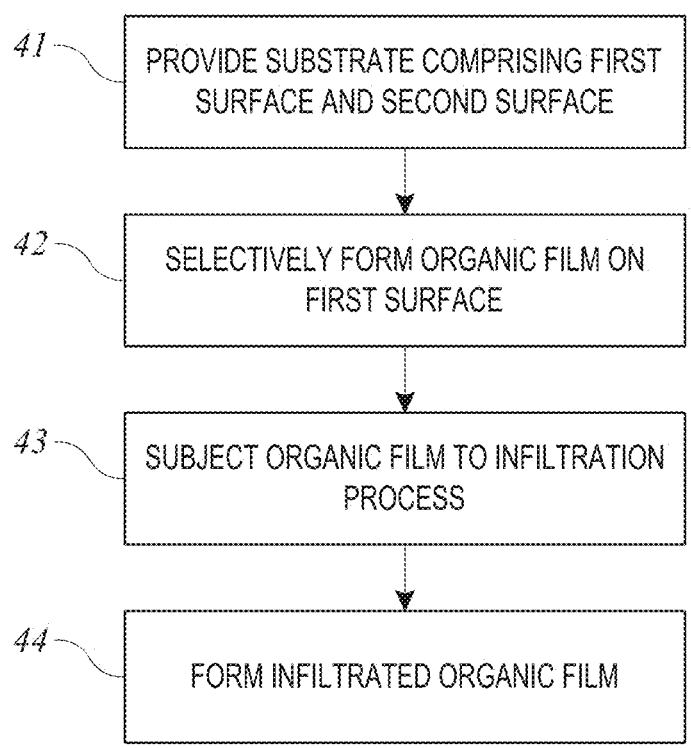
FIG. 4 is a flow diagram generally illustrating processes for infiltrating an organic film with inorganic material.

Referring to FIG. 4 and in some embodiments, a substrate comprising a first surface and a second surface is provided at block 41. The first and second surfaces may have different material properties. In some embodiments the first surface may be a conductive surface, for example a metal or metallic surface, and the second surface may be a dielectric surface. In some embodiments the first surface may be a dielectric surface and the second surface may be a second, different dielectric surface. In some embodiments the first and second surfaces may have the same basic composition, but may have different material properties due to different manners of formation (e.g., thermal oxide, deposited oxide, native oxide).

In some embodiments an organic film is selectively formed or deposited on the first surface of the substrate relative to the second surface of the substrate at block 42. In some embodiments the organic film may be selectively formed according to the selective deposition processes described herein, for example a selective deposition process comprising one or more deposition cycles as described herein. In some embodiments the selectively formed organic film may comprise, for example, a polyimide film.

In some embodiments the selectively formed organic film is subjected to an infiltration process to incorporate an inorganic material into the selectively formed organic film at block 43. In some embodiments the infiltration process may comprise one or more infiltration cycles comprising alternately and sequentially contacting the selectively formed organic film with a first reactant comprising a metal and a second reactant.

In some embodiments the material incorporated into the organic film by an infiltration process may comprise a metal. For example, the infiltrated material may comprise a metal, multiple metals, metal alloy, metal oxide, metal nitride, metal carbide material and combinations thereof. In some embodiments the metal may comprise a transition metal or post-transition metal. In some embodiments the metal may comprise aluminum or titanium. In some embodiments the material incorporated into the organic film by an infiltration process may comprise, for example, aluminum oxide ($Al_2O_3$) or titanium oxide ($TiO_2$).

In some embodiments where a selectively deposited organic film is infiltrated with a metal oxide the first reactant may comprise the metal of the metal oxide and the second reactant may comprise oxygen. In some embodiments where a selectively deposited organic film is infiltrated with a metal nitride the first reactant may comprise the metal of the metal oxide and the second reactant may comprise nitrogen. In some embodiments where a selectively deposited organic film is infiltrated with a metal carbide the first reactant may comprise the metal of the metal oxide and the second reactant may comprise carbon. In some embodiments where a selectively deposited organic film is infiltrated with a metal the first reactant may comprise the metal.

In some embodiments where a selectively deposited organic film is infiltrated with aluminum oxide ($Al_2O_3$) the first reactant may comprise aluminum and the second reactant may comprise oxygen. For example, in some embodiments where a selectively deposited organic film is infiltrated with aluminum oxide ($Al_2O_3$) the first reactant may comprise trimethylaluminum (TMA) and the second reactant may comprise $H_2O$. In some embodiments where a selectively deposited organic film is infiltrated with titanium dioxide ($TiO_2$) the first reactant may comprise titanium and the second reactant may comprise oxygen.

In some embodiments the first and second reactant used to infiltrate a selectively deposited organic film with a metal-containing material may be the same reactants used to deposit the metal-containing material in an atomic layer deposition process known in the art or developed in the future.

In block 44 an infiltrated organic film is formed on the first surface of the substrate. The skilled artisan will appreciate that the formation of the infiltrated organic film is the result of the above-described actions, 41-43, rather than a separate action.

In some embodiments an infiltration process may improve or enhance a certain property or properties of an organic film. For example, subjecting an organic film to an infiltration process may increase the etch resistance of the organic film against certain etchants or etch processes relative to the same organic film that has not been subjected to an infiltration process. In some embodiments subjecting an organic film to an infiltration process may increase the etch resistance of the organic film against halide based etch processes, for example, Cl, Br, or F based processes, such as an HF etch, relative to the same organic film that has not been subjected to an infiltration process. The etch resistance may be effective against vapor, liquid or reactive ion etch (RIE) processes. Hard mask layers are often subjected to anisotropic RIE processes for achieving more vertical sidewalls in the etched film, as will be understood by the skilled artisan. For example, in some embodiments an organic film subjected to an infiltration process may increase the etch resistance of an organic film, such as an organic film selectively deposited as described herein. In some embodiments other properties of the organic film may be altered by an infiltration process, for example an infiltration process may increase the density, conductivity, resistance, and/or hardness of an organic film.

Figure 5:
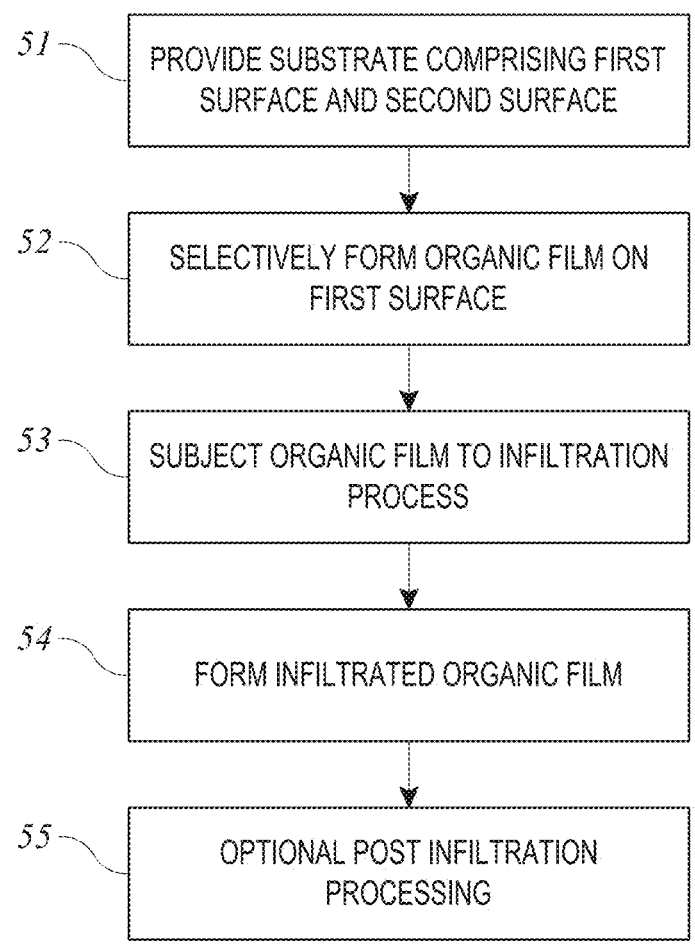
FIG. 5 is a flow diagram generally illustrating processes for infiltrating an organic film with inorganic material including an ashing process to reduce or eliminate carbon from the film.

Referring to FIG. 5 and according to some embodiments, a substrate comprising a first surface and a second surface is provided at block 51. The first and second surfaces may have different material properties. In some embodiments the first surface may be a conductive surface, for example a metal or metallic surface, and the second surface may be a dielectric surface. In some embodiments the first surface may be a dielectric surface and the second surface may be a second, different dielectric surface. In some embodiments the first and second surfaces may have the same basic composition, but may have different material properties due to different manners of formation (e.g., thermal oxide, deposited oxide, native oxide).

In some embodiments an organic film is selectively formed or deposited on the first surface of the substrate relative to the second surface of the substrate at block 52. In some embodiments the organic film may be selectively formed according to the selective deposition processes described herein, for example a selective deposition process comprising one or more deposition cycles as described herein. In some embodiments the selectively formed organic film may comprise, for example, a polyimide film.

In some embodiments the selectively formed organic film is subjected to an infiltration process to incorporate an inorganic material into the selectively formed organic film at block 53. In some embodiments the infiltration process may comprise one or more infiltration cycles comprising alternately and sequentially contacting the selectively formed organic film with a first reactant comprising a metal and a second reactant.

In block 54 an infiltrated organic film is formed on the first surface of the substrate. The skilled artisan will appreciate that the formation of the infiltrated organic film is the result of the above-described actions, 51-53, rather than a separate action.

In some embodiments the infiltrated organic film, may be subjected to an optional post infiltration process at block 55. In some embodiments the post infiltration process may comprise an ashing process in order to remove or substantially reduce the amount of carbon in the film. In some embodiments an ashing process may comprise exposing the infiltrated organic film to a plasma. In some embodiments the plasma may comprise oxygen atoms, oxygen radicals, oxygen plasma, or combinations thereof. In some embodiments the plasma may be generated from a gas comprising oxygen, for example $O_2$.

In some embodiments an infiltrated film, such as an infiltrated selectively deposited organic film or infiltrated organic film subjected to an ashing process, may be used as a hardmask, or etch mask, for subsequently etching the substrate onto which the organic film is deposited, as described below with respect to FIGS. 6 and 7. In some embodiments an infiltrated organic film, such as an infiltrated selectively deposited organic film may be used as a permanent or functional layer in an electronic or semiconductor device. For example, in some embodiments an infiltrated organic film, such as an infiltrated selectively deposited organic film may be used as an isolation layer, a contact or electrode material, a spacer layer, a channel layer, or any other functional layer.

Integration

The organic films of the present disclosure may be used in a variety of microfabrication, nanofabrication, and/or semiconductor fabrication applications. For example, selectively deposited polymer films may be particularly useful as etch masks for use in semiconductor device fabrication. Etch masks may be used to protect the area of the substrate under the etch mask from exposure to an etchant while other areas are etched. Etch masks may be used, for example, to pattern layers of material during the fabrication of a semiconductor device. In some embodiments the ability to selectively deposit an organic film to serve as an etch mask can allow for simplification of many microfabrication, nanofabrication, and/or semiconductor fabrication processes. Further, because a selectively deposited organic film is deposited exclusively or predominantly on a first surface of the substrate relative to a second surface, the selectively deposited organic film is self-aligned to the first surface of the substrate, thereby eliminating or reducing the problem of misalignment that typically occurs with lithographic patterning and the blanket formation of photoresist films over the substrate.

Figure 6:
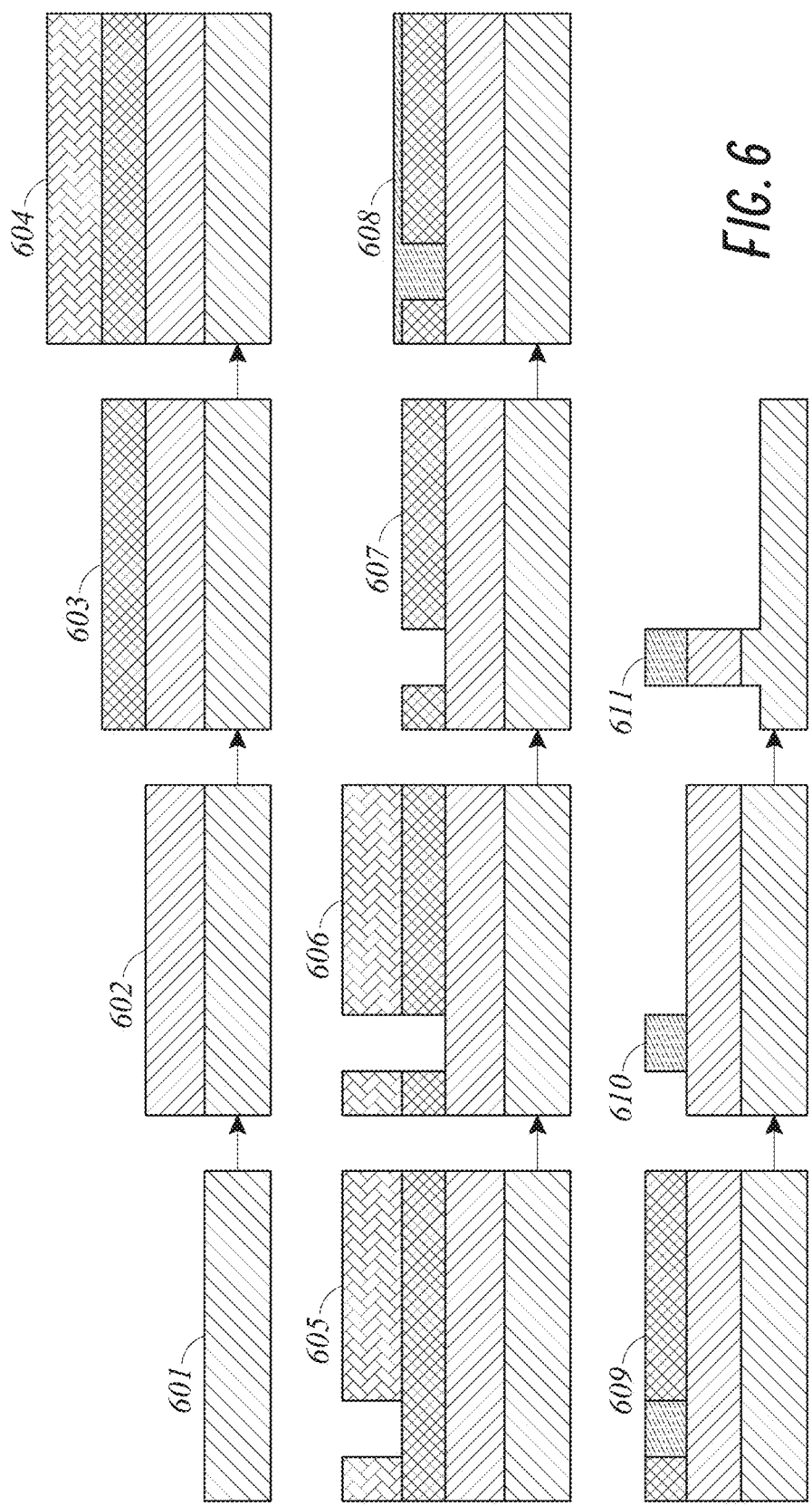
FIG. 6 is a series of schematic cross sections generally illustrating an exemplary tone reversal process for forming a feature on a substrate using an organic film selectively deposited on a first surface of a substrate relative to a second dielectric surface.

FIG. 6 illustrates an exemplary process flow for a tone reversal process for forming one or more structures on a substrate utilizing a selectively deposited polyimide film as an etch mask. In some embodiments the tone reversal process for forming one or more structures proceeds as follows:

A suitable substrate is provided at stage 601;

A first layer of the material which is to form the structure, for example titanium nitride, is deposited over the substrate at stage 602. The layer may be a material to serve as the first surface on which organic material can be selectively deposited, as disclosed herein, such as a metallic material, and can be titanium nitride (TiN) in one embodiment;

A second layer that is capable of being etched selectively relative to the underlying first layer and which can comprise the second surface for inhibiting deposition from a selective deposition process, for example $SiO_2$ or other dielectric, is deposited over the first layer at stage 603;

The second layer is then patterned, for example by a photolithographic patterning process including deposition of a photoresist layer at stage 604, patterning of the photoresist layer at stage 605, transferring of the pattern to the second layer, for example by etching, at stage 606, and removing any residual photoresist material at stage 607;

An organic film, for example a polyimide film, is selectively deposited on the exposed first layer relative to the second layer to thereby form the etch mask at stage 608;

Organic material that is present on the second layer, if any, is optionally removed, for example by isotropic etching, at stage 609;

The second layer is then removed, for example by selective oxide etching (e.g., by HF or other halide etching including RIE), such that the first layer (e.g., TiN) and the selectively deposited organic film (e.g., polyimide) remain on the substrate at stage 610; and The portion of the first layer that is not disposed under the etch mask is removed, for example by selectively etching the first layer without fully removing the organic film, e.g., by HF or other halide etching, at stage 611, thereby forming the desired structure. In some embodiments some or all of the organic film may be removed by the etching process, as long as the organic layer is not fully consumed by the etch. In some embodiments, the etch rate of the infiltrated organic film is about the same or less than the etch rate of the first layer. Accordingly, even a physical or sputter etch, which is not chemically selective, may be employed to transfer the inverted pattern (e.g., a pillar or other island pattern) into the first layer prior to erosion of the organic mask feature. In another embodiment, a combination of a physical and chemical etch (e.g., reactive ion etch, RIE) may transfer the inverted pattern into the first layer, and the chemical component to the etch may be partially or fully selective. RIE and physical etches may be directional or anisotropic, producing closer to vertical sidewalls compared to isotropic etches and thus produce greater fidelity between mask features and the features in layers patterned by the etch. In the illustrated embodiment, the pattern is also extended into the underlying substrate (or intervening layers). The first layer may form part of the final product and the organic mask subsequently removed. Alternatively, the first layer may serve as a hard mask and also be removed after transfer of the pattern into the underlying substrate or intervening layer(s).

In some embodiments the formed structure may comprise a pillar of the material comprising the first layer and/or underlying substrate (or intervening layer(s)). In some embodiments the structure may comprise a three-dimensional structure or structures for use in a semiconductor device. In some embodiments the selective deposition process performed at stage 608 may comprise any of the selective deposition processes described herein.

As noted above, the selectively deposited organic material may be infiltrated with a metal to increase its resistance to selective etches at stages 609-611, and particularly for the oxide removal between stages 609 and 610.

FIGS. 7A and 7B illustrate an exemplary process flow for a block mask process for forming one or more structures on a substrate utilizing a selectively deposited polyimide film as a block mask. As an example, a block mask may be useful to modify the primary mask pattern, by blocking a desired portion or portions of primary mask pattern from transfer to the underlying layer(s). For example, a spacer process forms lines and it may be desirable to transfer the pattern formed by these lines with additional features between them, such as a bridge connecting two lines as shown in FIGS. 7A-7B, into lower layers of the substrate. In some embodiments the block mask process for forming one or more structures proceeds as follows:

A suitable substrate, for example a substrate comprising a low-k material, a nitrogen-free antireflection layer (NFARL), a first layer upon which organic material can be selectively deposited (e.g., TiN), a silicon oxide layer formed via PECVD including tetraethylorthosilicate (PE-TEOS layer), and an amorphous silicon layer, is provided at stage 701;

Mandrels are patterned or formed in the amorphous silicon layer at stage 702;

Spacer material, for example a dielectric material, is conformally deposited over the mandrels at stage 703, and tend to form loops around the mandrel features in the horizontal dimensions (e.g., a plan view);

The spacer material deposited on horizontal surfaces is selectively removed, for example by a directional etching process at stage 704;

The mandrels are removed, for example by selective etching, to thereby form spacers at stage 705;

A hardmask, which can comprise a low-k material, is deposited over the spacers and substrate at stage 706;

A mask pattern is formed in the surface of the hardmask, for example by lithographic patterning, to expose the region of the pattern to be blocked, at stage 707;

The patterned portion of the hardmask and underlying PETEOS layer are removed, for example by etching, to thereby expose a portion of the first layer (e.g., TiN) at stage 508;

The remaining hardmask material is removed from the substrate at stage 709;

An organic film, for example a polyimide film, is selectively deposited on the exposed portion of the first layer (e.g., TiN) relative to the remaining PETEOS layer to thereby form a block mask at stage 710;

The remaining PETEOS layer, and the pattern as modified by the block mask is transferred into the first layer by removal of the portion of the first layer (e.g., TiN) that is not disposed under the spacers or the organic block mask, for example by a selective etch, at stage 711;

Any remaining spacer material and organic film material is removed at stage 712, thereby leaving the first layer (e.g., TiN) in the modified pattern. The so-patterned first layer may form functional structures in the final product (e.g., metallic lines) or may serve as hard masks for further transfer of the pattern into underlying materials. A plan view of stages 710-712 is illustrated in FIG. 7B

In some embodiments the selectively deposited organic block mask may be used to etch rectangular trenches in a film that can subsequently be filled with copper or another conductive material. In some embodiments the structure may comprise a three-dimensional structure or structures for use in a semiconductor device. In some embodiments the selective deposition process performed at stage 710 may comprise any of the selective deposition processes described herein.

In some embodiments a selectively deposited organic film may be used as a protection layer in a subsequent selective deposition process, such as a dielectric material selective deposition process. For example, in some embodiments an organic film may be selectively deposited on a first surface of a substrate relative second surface as described herein and then a dielectric material may be selectively deposited on the second surface of the substrate relative to the organic film.

Example 1

Sample polyimide thin films were deposited on a number of substrates according to selective deposition processes described herein. 200 mm silicon wafers having tungsten (W) features alternated with silicon oxide surfaces were used as substrates. The width of the tungsten features was 250 nm with a pitch of approximately 600 nm. The polyimide deposition processes were performed in a Pulsar 3000® cross-flow ALD reactor connected with PRI cluster tool.

A first batch of sample polyimide films were deposited according to the processes described herein using DAH as a first vapor phase reactant and PMDA as a second vapor phase reactant. The DAH first reactant was supplied at 45° C. by an $N_2$ carrier gas having a flow rate of 450 sccm. The DAH pulse time was 5 seconds and the DAH pure time was 4 seconds. The PMDA second reactant was supplied to the reaction chamber at 180° C. by an $N_2$ carrier gas having a flow rate of 450 sccm. The PMDA pulse time was 11 seconds and the PMDA purge time was 4 seconds. The reaction or substrate temperature was 160° C. Polyimide films were deposited using between 25 and 100 deposition cycles.

A second batch of sample polyimide films were deposited according to the processes described herein using substantially similar conditions as the first batch, but having a reaction temperature of 190° C. Polyimide films were deposited using between 250 and 1000 deposition cycles.

The thicknesses of the polyimide film samples were measured using scanning transmission electron microscopy. The first batch of polyimide films were found to have thicknesses between 5 nm for a process having 25 deposition cycles and 40 nm for a process having 100 deposition cycles with a growth rate of about 4-6 Å/cycle. The amount of polyimide deposited on the W surfaces of the substrate was substantially the same as the amount of polyimide deposited on the silicon oxide surface. Therefore, the deposition was not selective at a reaction temperature of 160° C. for this recipe.

Figure 8:
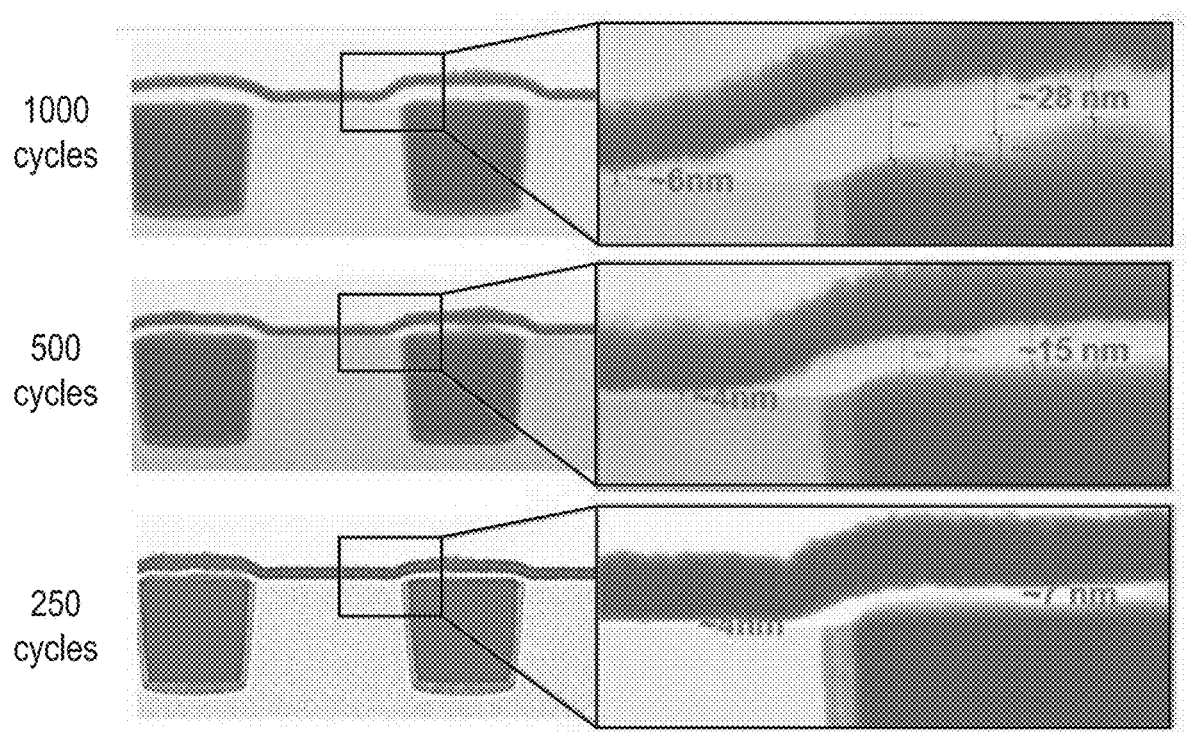
FIG. 8 is a series of cross-sectional scanning transmission electron micrographs showing the thicknesses of selectively deposited polyimide films.

The second bath of polyimide films were found to have thicknesses ranging from about 7 nm for a process having 250 cycles to about 28 nm for a process having 1000 cycles on the W surfaces. Polyimide film thicknesses on the silicon oxide surfaces ranged from about 4 nm for a process having 250 cycles to about 6 nm for a process having 1000 cycles. Therefore, the polyimide deposition was selective at a reaction temperature of 190° C. The growth rate on the W surfaces was about 0.2-1 Å/cycle. FIG. 8 shows cross-sectional STEM images of polyimide films selectively deposited on W surfaces relative to $SiO_2$ surfaces utilizing between 250 and 1000 deposition cycles.

Example 2

A first sample polyamide film was deposited on a 200 mm silicon wafer having patterned tungsten (W) features alternated with silicon oxide surfaces. A second sample polyamide film was deposited on a crystalline silicon wafer having 1.5 nm of native oxide. The samples were deposited according to the processes described herein using adipoyl chloride (AC) as a first vapor phase reactant and ethylene diamine (EDA) as a second vapor phase reactant. The AC first reactant was vaporized at a temperature of 50° C. and supplied to the reaction chamber at a temperature of 65° C. with a line flow of 500 sccm. The AC pulse and purge times were 2.5 seconds. A pulsing pressure of about 180 Torr was used and the conduit through which the AC was supplied was fitted with a line filter. The ED second reactant was supplied at room temperature with pulse and purge times of ⅕ seconds. A pulsing pressure of about 100 Torr was used and the conduit through which the ED was supplied was not fitted with a line filter. The temperature of the substrate was 95° C. and the process included 1000 deposition cycles.

Figure 9A:
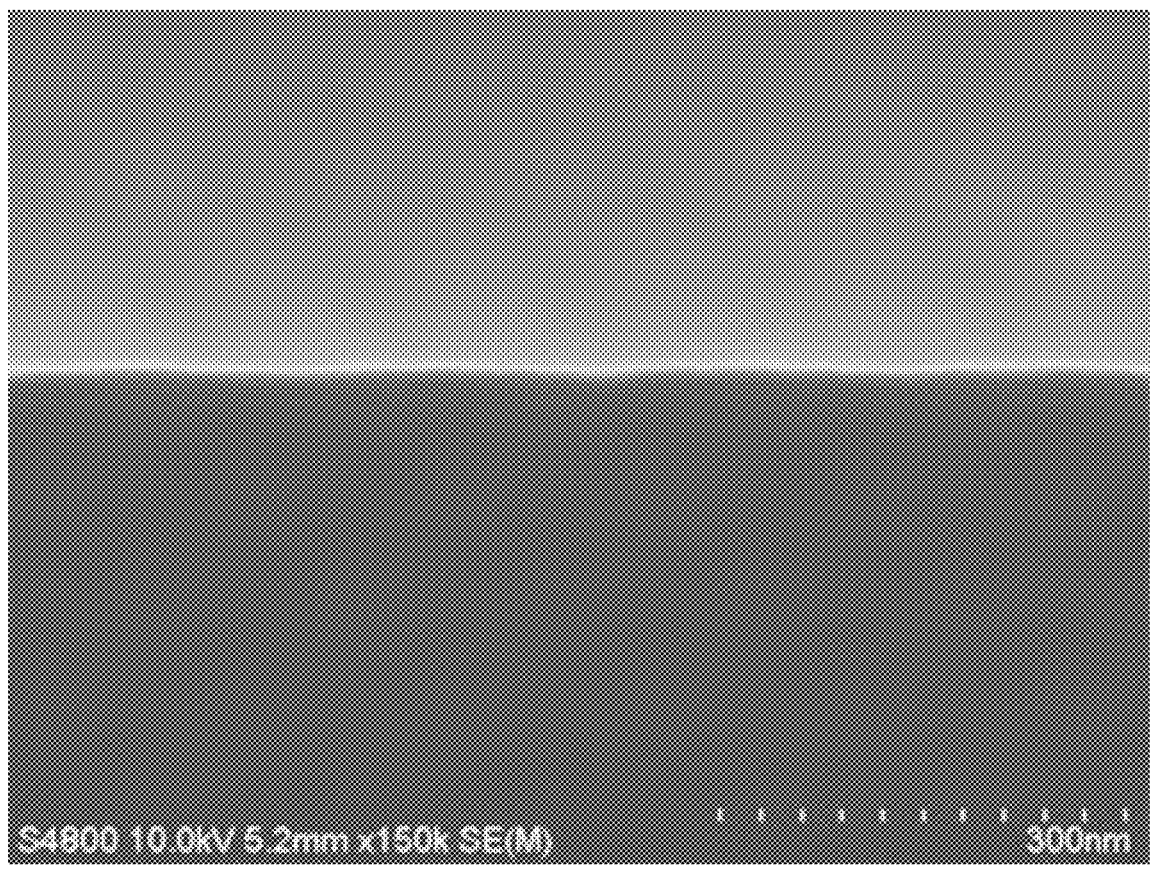
FIG. 9A is a cross-section scanning electron micrograph of a polyamide film deposited on a crystalline silicon substrate having a 1.5 nm native oxide surface.

The resultant films were characterized by spectroscopic ellipsometry and thickness verification was done with x-ray reflectometry. The growth rate for the polyamide film deposited on the crystalline silicon substrate with 1.5 nm of native oxide was found to be about 0.5 Å/cycle and 1σ thickness non-uniformity was around 3% for 300 mm mapping with 3 mm edge exclusion. The film was found to have a thickness of about 9 nm, as shown in FIG. 9A.

Figure 9B:
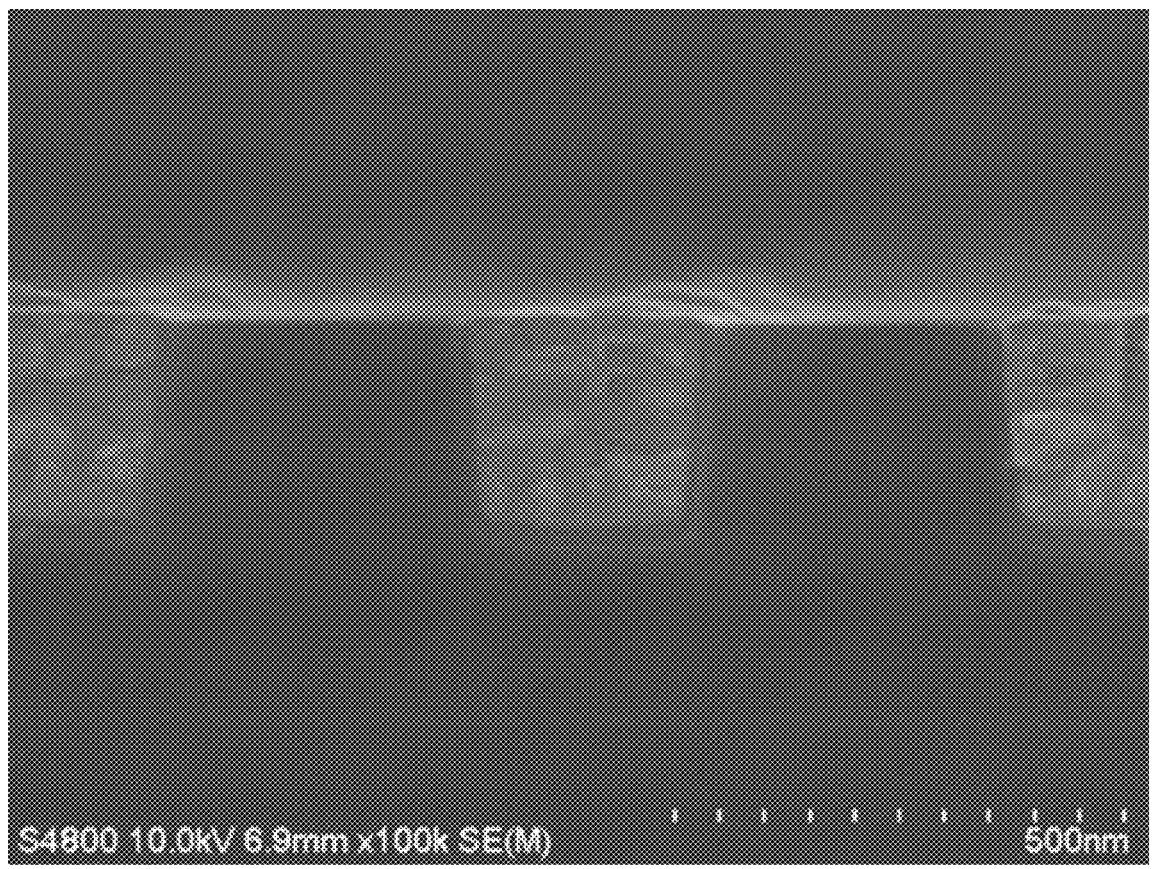
FIG. 9B is a cross-sectional scanning electron micrograph of a polyamide film selectively deposited on the W surfaces of a substrate relative to the oxide surfaces of the same substrate.

It was found that almost no polyamide was deposited on the native oxide surface of the W patterned wafer, while polyamide material is clearly visible on the W lines, as shown in FIG. 9B. Therefore, the polyamide deposition of the W patterned wafer was found to be selective.

Example 3

Figure 10A:
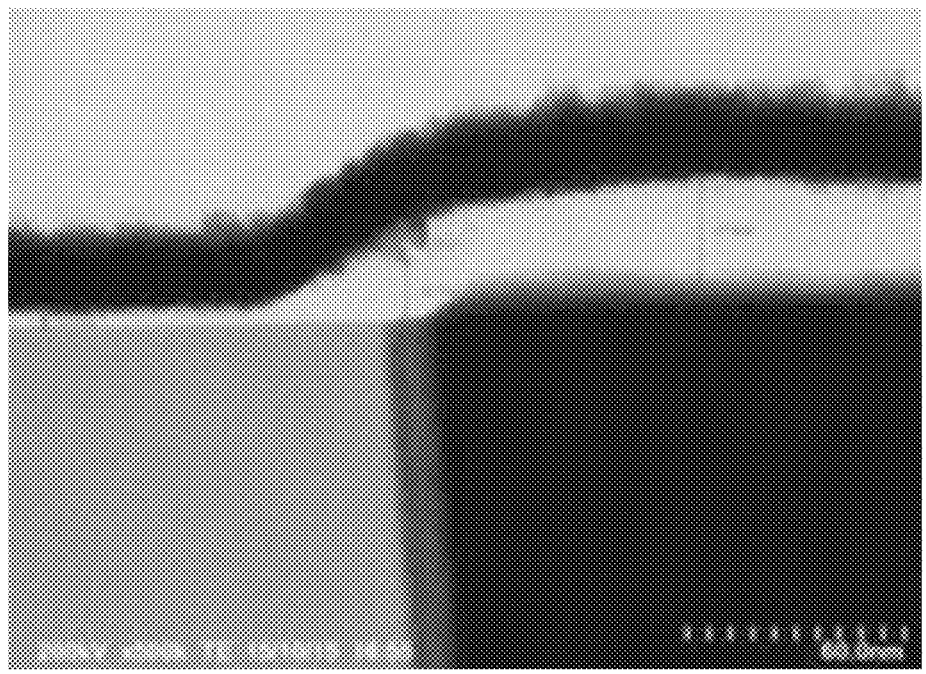
FIG. 10A is a cross-sectional scanning transmission electron micrograph of a polyamide thin film selectively deposited on a W surface of a substrate relative to a silicon oxide surface of the same substrate.

A sample polyimide film was selectively deposited on a 200 mm silicon wafer having patterned tungsten (W) features alternated with silicon oxide surfaces according to the processes described herein using DAH as a first vapor phase reactant and PMDA as a second vapor phase reactant. The DAH first reactant was supplied at 45° C. by an $N_2$ carrier gas having a flow rate of 450 sccm. The DAH pulse time was 5 seconds and the DAH pure time was 4 seconds. The PMDA second reactant was supplied to the reaction chamber at 180° C. by an $N_2$ carrier gas having a flow rate of 450 sccm. The PMDA pulse time was 11 seconds and the PMDA purge time was 4 seconds. The reaction temperature was 190° C. The polyimide sample film was deposited using 1000 deposition cycles. The polyimide was deposited on the W surface, with a film thickness of about 30 nm. A substantially lesser amount of polyimide was deposited on the silicon oxide surface, about 4 nm, as shown in FIG. 10A.

Figure 10B:
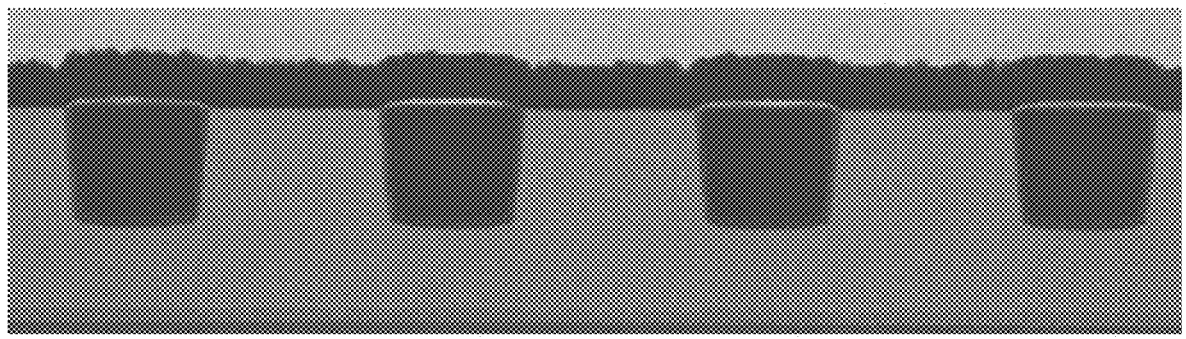
FIG. 10B is a cross-sectional scanning transmission electron micrograph of a polyamide thin film selectively deposited on a W surface of a substrate relative to a silicon oxide surface of the same substrate after being subjected to an etching process.
Figure 10C:
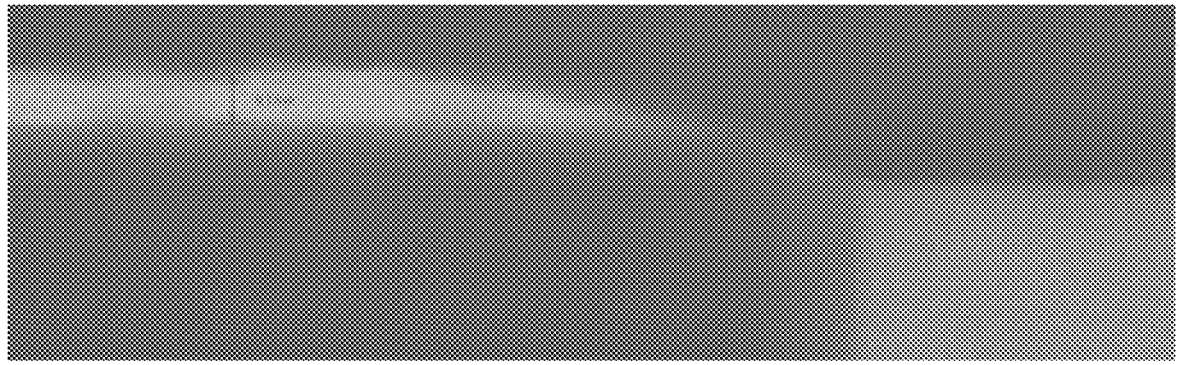
FIG. 10C is a magnified view of the polyamide thin film on the W surface and the adjacent silicon oxide surface of FIG. 10B.

The sample polyimide film was then etched with $H_2$ plasma generated using 100 W at a temperature of 300° C. for 40 seconds. The flow rate of the $H_2$ gas was 100 sccm. As shown in FIGS. 10B-C, polyimide was completely removed from the silicon oxide surface while a polyimide film having a thickness of about 9 nm was left on the W surface.

Example 4

Sample polyamide (2,6) films were deposited according to processes described herein. Adipoyl chloride (AC) and ethylene diamine (EDA) were used as reactants. The AC reactant was heated to a temperature of 50° C. and vaporized. The EDA reactant was vaporized at room temperature, with needle valves being used to control the reactant dose. Nitrogen was used as both a carrier gas for the reactants and a purge gas. Both the carrier and purge gas flow was about 500 sccm. Samples were deposited on 300 mm crystalline silicon wafers having a surface comprising about 1.5 nm native oxide. For each sample 200 deposition cycles were carried out. The thickness of the deposited films was measured using an ellipsometer.

Sample films were deposited with the EDA contacting times varied between 0 and 3 seconds at a deposition temperature of 71° C. As seen in FIG. 9A, the growth rate per cycle of the polyamide films increased with increasing EDA contacting time, reaching about 0.5 Å/cycle for an EDA contacting time of 3 seconds.

Figure 11A:
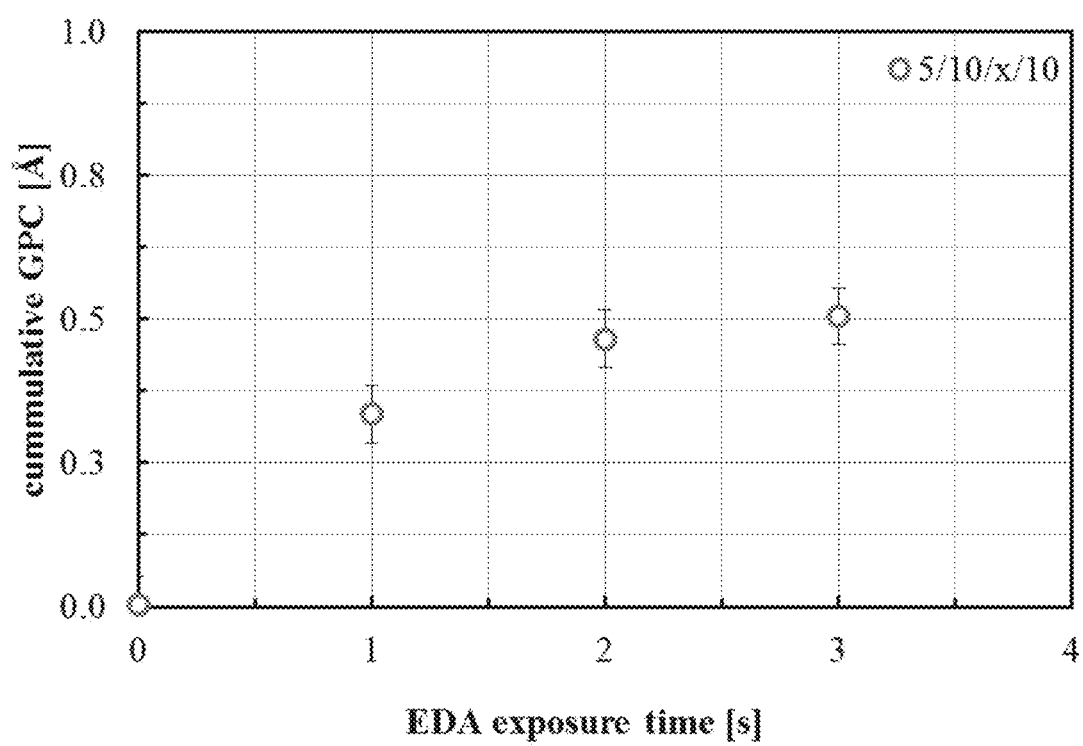
FIG. 11A is a plot showing growth rate (Å/cycle) as a function of ethylenediamine (EDA) precursor contacting time (seconds) for polyamide sample films deposited according to some embodiments.
Figure 11B:
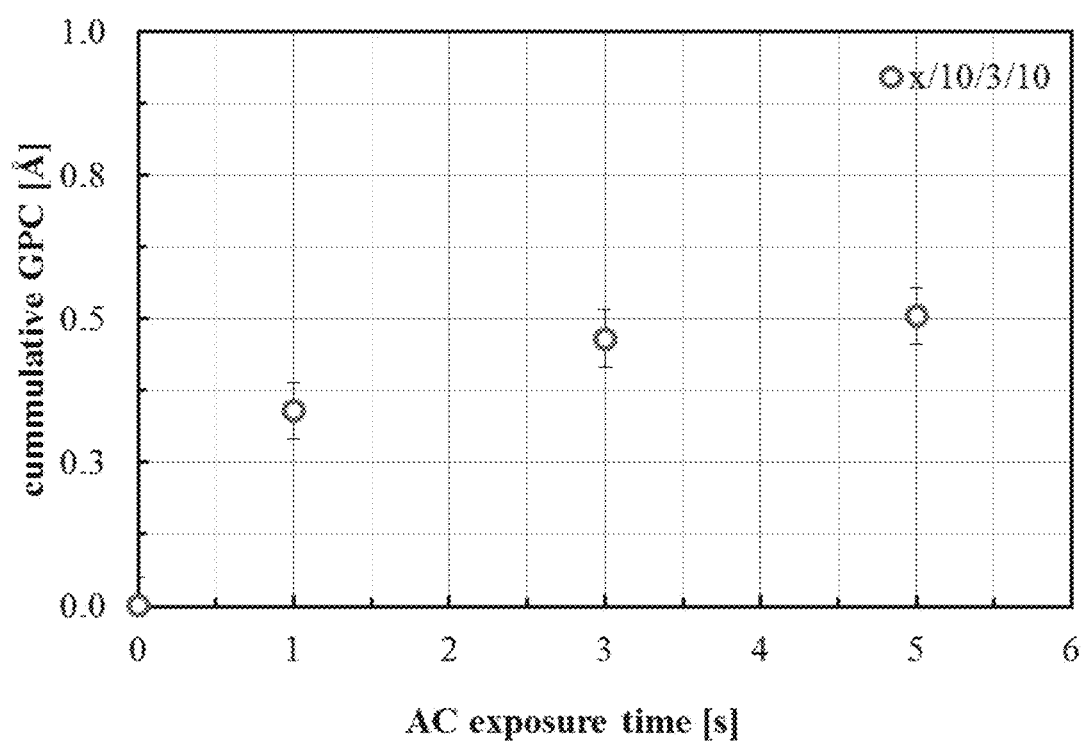
FIG. 11B is a plot showing growth rate (Å/cycle) as a function of adipoyl chloride (AC) precursor contacting time (seconds) for polyamide sample films deposited according to some embodiments.
Figure 11C:
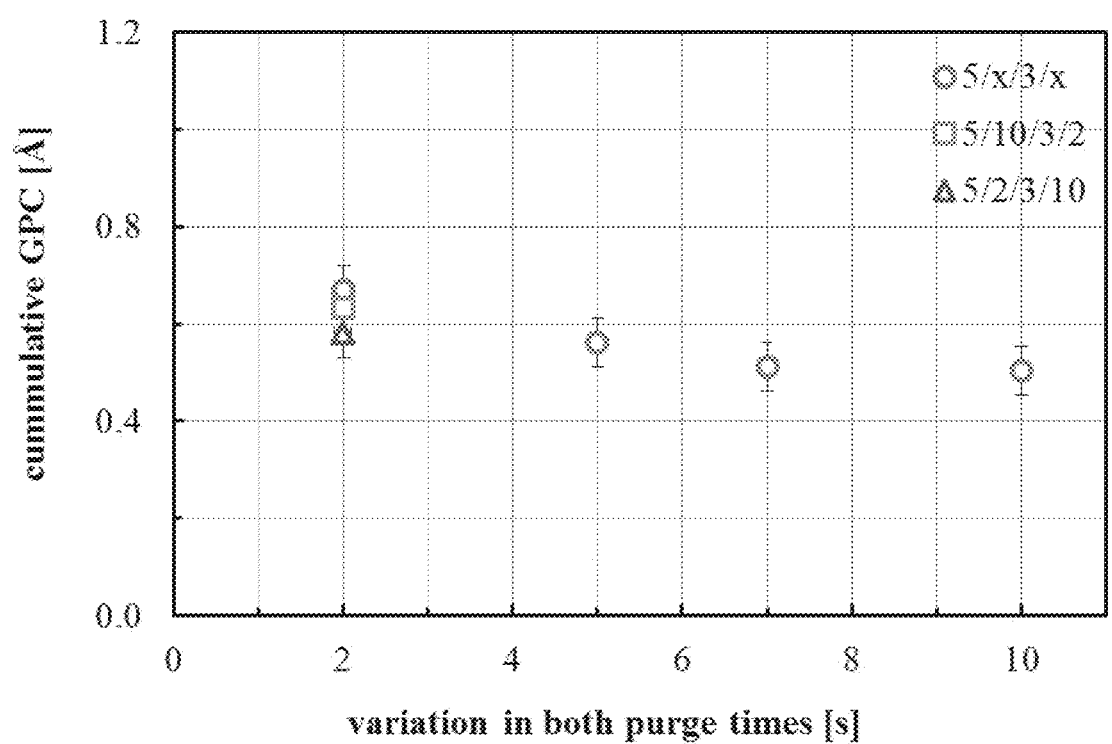
FIG. 11C is a plot showing growth rate (Å/cycle) as a function of precursor removal time (seconds) for polyamide sample films deposited according to some embodiments.

Similarly, sample films were deposited with the AC contacting times varied between 0 and 5 seconds at a deposition temperature of 71° C. As seen in FIG. 9B, the growth rate per cycle of the polyamide films increased with increasing AC contacting time, reaching a about 0.5 Å/cycle for an AC contacting time of 5 seconds The precursor and reaction by-product removal, or purge, time was likewise varied for sample polyamide films. The removal times were varied between 2 and 10 seconds. As seen in FIG. 11C, the growth rate per cycle decreased with increasing removal time, although the effect appeared to be relatively small.

Figure 11D:
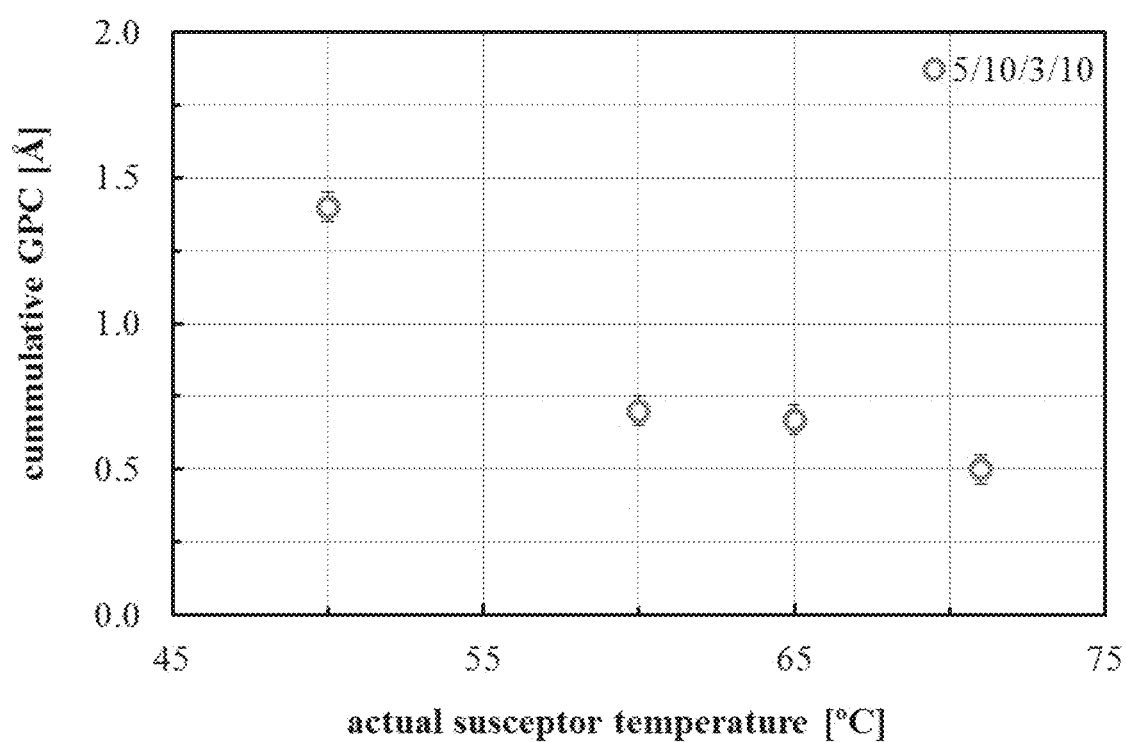
FIG. 11D is a plot showing growth rate (Å/cycle) as a function of deposition temperature for polyamide sample films deposited according to some embodiments.

The relationship between growth rate and deposition temperature was also investigated. Sample films were prepared with deposition temperatures varying from 50° C. to 71° C. As can be seen in FIG. 11D, growth rate per cycle increased with decreasing deposition temperature, reaching a growth rate of 1.4 Å/cycle at a deposition temperature of 50° C.

Figure 12A:
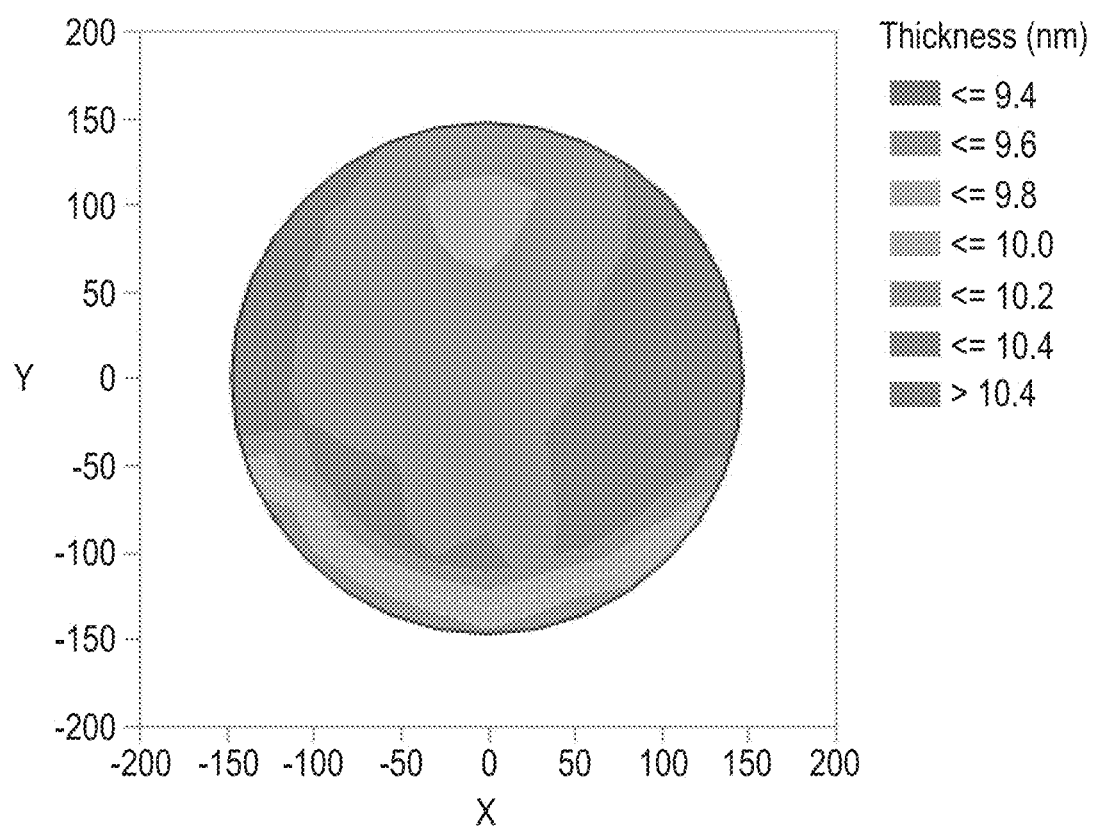
FIG. 12A shows an ellipsometer thickness map for a polyamide film deposited at 71° C. according to some embodiments.
Figure 12B:
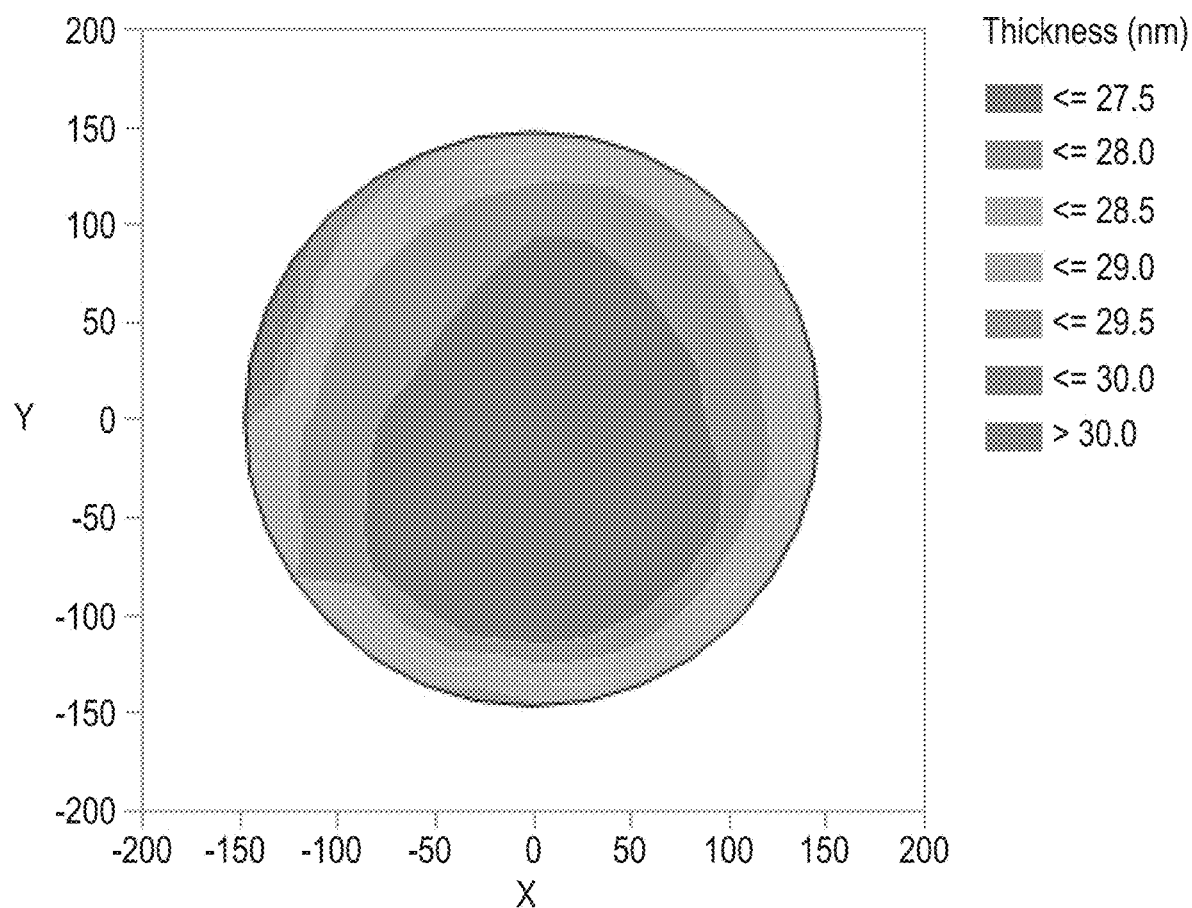
FIG. 12B shows an ellipsometer thickness map for a polyamide film deposited at 50° C. according to some embodiments.

FIG. 12A shows a thickness map for a sample polyamide films deposited at 71° C. FIG. 12B shows a thickness map for a sample polyamide films deposited at 50° C. The 1σ non-uniformity of the sample film deposited at 71° C. was found to be 3.0%, while the 1σ non-uniformity of the sample film deposited at 50° C. was found to be 2.6%. Further, the non-uniformity occurred primarily at the edges of the wafer, therefore the deposited sample films were found to be considerably uniform.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A process for selectively processing a substrate, the process comprising:
   patterning a second layer that is over a first layer of the substrate, such that a first surface of the first layer is exposed;
   forming spacers over a second surface of the second layer;
   exposing the first surface between at least two of the spacers;
   selectively depositing an organic film on the exposed first surface of the first layer relative to the second surface of the second layer, wherein the first surface and the second surface have different compositions, wherein the organic film is deposited between the at least two of the spacers;
   subjecting the organic film to an infiltration process to incorporate metal into the organic film and thereby form an infiltrated film, wherein a mask comprises the infiltrated film; and
   processing the substrate using the mask, said processing comprising selectively removing material of a first layer that is not under the mask or the spacers relative to material of the first layer that is under the mask and the spacers, wherein the first layer comprises the first surface, wherein the mask comprises the organic film on the first surface.

2. The process of claim 1, wherein the first surface is a metallic surface.

3. The process of claim 2, wherein the second surface is a dielectric surface.

4. The process of claim 1, wherein the mask is an etch mask, said processing the substrate comprises etching the second layer, and said etching is selective to material of the second layer relative to the mask.

5. The process of claim 4, wherein and said processing the substrate comprises further etching the first layer selectively relative to the mask to form a structure.

6. The process of claim 5, wherein the structure comprises a pillar.

7. The process of claim 1, wherein said patterning the second layer comprises using photolithography.

8. The process of claim 1, wherein said processing the substrate comprises using the mask as an etch mask in a tone reversal process.

9. The process of claim 8, wherein the first surface is a metallic surface, and the second surface is a dielectric surface.

10. The process of claim 8, wherein said patterning the second layer comprises patterning a photoresist over the second layer, and the tone reversal process results in the first layer having a pattern that is inverted relative to the photoresist.

11. The process of claim 8, further comprising subjecting the organic film to an infiltration process to incorporate metal into the organic film and thereby form an infiltrated film, wherein the mask comprises the infiltrated film, and wherein the infiltrated film has an increased resistance to selective etching of said processing relative to the organic film.

12. The process of claim 1, wherein the organic film comprises a polyimide film.

13. The process of claim 1, wherein a selectivity for depositing the organic film on the first surface relative to the second surface is at least 80%.

14. The process of claim 1, wherein there is no organic material of the organic film on the second surface during said processing the substrate.

15. A process for selectively processing a substrate, the process comprising:

patterning a second layer that is over a first layer of the substrate, such that a first surface of the first layer is exposed;

selectively depositing an organic film on the exposed first surface of the first layer relative to a second surface of the second layer, wherein the first surface and the second surface have different compositions; and processing the substrate using a block mask, wherein the block mask comprises the organic film on the first surface and wherein said processing the substrate comprises using the block mask in a block mask process to modify a primary mask by blocking a portion of the primary mask.

16. The process of claim 15, wherein the second surface has a primary mask pattern thereon prior to said selectively depositing, and wherein the block mask modifies the primary mask pattern for said processing the substrate.

17. The process of claim 15, wherein:

said patterning the second layer comprises forming a hard mask, lithographically patterning the hard mask, and exposing the first surface by etching through the second layer when the patterned hard mask is over the second layer; and said selectively depositing the organic film comprises selectively depositing onto the first surface relative to the second surface and a material of the hard mask.

18. The process of claim 15, wherein a selectivity for depositing the organic film on the exposed first surface of the first layer relative to the second surface of the second layer is at least 80%.

19. The process of claim 15, wherein there is no organic material of the organic film on the second surface during said processing the substrate.

* * * * *